United States Patent
Yahagi

(10) Patent No.: US 8,476,621 B2
(45) Date of Patent: Jul. 2, 2013

(54) RESIN COMPOSITION, GATE INSULATING LAYER, AND ORGANIC THIN FILM TRANSISTOR

(75) Inventor: Isao Yahagi, Tsuchiura (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 298 days.

(21) Appl. No.: 13/060,456

(22) PCT Filed: Aug. 25, 2009

(86) PCT No.: PCT/JP2009/064768
§ 371 (c)(1),
(2), (4) Date: Apr. 28, 2011

(87) PCT Pub. No.: WO2010/024238
PCT Pub. Date: Mar. 4, 2010

(65) Prior Publication Data
US 2011/0193071 A1    Aug. 11, 2011

(30) Foreign Application Priority Data

Aug. 28, 2008  (JP) .................... 2008-219846
Feb. 9, 2009   (JP) .................... 2009-027625
Jul. 17, 2009  (JP) .................... 2009-168912

(51) Int. Cl.
   *H01L 35/24*   (2006.01)
(52) U.S. Cl.
   USPC .................... 257/40; 257/E51.001
(58) Field of Classification Search
   USPC ............................ 257/40, E51.001
   See application file for complete search history.

(56) References Cited

U.S. PATENT DOCUMENTS

| | | |
|---|---|---|
| 5,637,156 A | 6/1997 | Kubota et al. |
| 2006/0006380 A1 | 1/2006 | Shin et al. |

FOREIGN PATENT DOCUMENTS

| | | |
|---|---|---|
| CN | 1509361 A | 6/2004 |
| CN | 1920666 A | 2/2007 |
| JP | 08-231675 A | 9/1996 |
| JP | 2005-281530 A | 10/2005 |
| JP | 2006-028497 A | 2/2006 |
| JP | 2007-042852 A | 2/2007 |
| JP | 2007-177041 A | 7/2007 |

(Continued)

OTHER PUBLICATIONS

D. K. Hwang, et al., "Comparative studies on the stability of polymer versus SiO₂ gate dielectrics for pentacene thin-film transistors", Applied Physics Letters, 2006, 093507-1-093507-3, vol. 89.

(Continued)

*Primary Examiner* — Anthony Ho
(74) *Attorney, Agent, or Firm* — Sughrue Mion, PLLC

(57) ABSTRACT

The subject of the present invention is to provide an organic thin film transistor with a small hysteresis. The means for solving the subject is a resin composition for an organic thin film transistor gate insulating layer comprising (A) a macromolecule that comprises at least one repeating unit selected from the group consisting of repeating units represented by Formula (1), repeating units represented by Formula (1'), and repeating units represented by Formula (2) and contains two or more first functional groups in its molecule, wherein the first functional group is a functional group that generates, by the action of electromagnetic waves or heat, a second functional group that reacts with active hydrogen, and (B) at least one compound selected from the group consisting of low-molecular compounds containing two or more active hydrogens in each molecule and macromolecules containing two or more active hydrogens in each molecule.

11 Claims, 1 Drawing Sheet

FOREIGN PATENT DOCUMENTS

Figure 1:
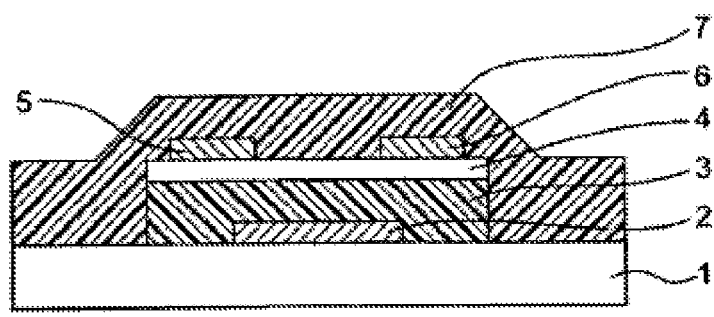

| | | |
|---|---|---|
| JP | 2007-305950 A | 11/2007 |
| JP | 2008-007559 A | 1/2008 |
| JP | 2010-007030 A | 1/2010 |
| JP | 2010-010608 A | 1/2010 |
| WO | 03/054284 A1 | 7/2003 |
| WO | 2009/037820 A1 | 3/2009 |

OTHER PUBLICATIONS

Se Hyun Kim, et al., "Hysteresis-free pentacene field-effect transistors and inverters containing poly(4-vinyl phenol-co-methyl methacrylate) gate dielectrics", Applied Physics Letters, 2008, 183306-1-183306-3, vol. 92.

Extended European Search Report issued Feb. 10, 2012 in European Patent Appln. No. 09809889.0 to Sumitomo Chemical Co., Ltd.

First Office Action issued Aug. 31, 2012 in Chinese Patent Application No. 200980133841.7 to Sumitomo Chemical Co., Ltd., with English translation.

Translation of International Preliminary Report on Patentability issued Apr. 12, 2011, in PCT/JP2009/064768.

RESIN COMPOSITION, GATE INSULATING LAYER, AND ORGANIC THIN FILM TRANSISTOR

This application is a National Stage of International Application No. PCT/JP2009/064768 filed Aug. 25, 2009, claiming priority based on Japanese Patent Application Nos. 2008-219846 filed Aug. 28, 2008, 2009-027625 filed Feb. 9, 2009 and 2009-168912 filed Jul. 17, 2009, the contents of all of which are incorporated herein by reference in their entirety.

TECHNICAL FIELD

The present invention relates to resin compositions and particularly to resin compositions for organic thin film transistor gate insulating layers.

BACKGROUND ART

Since organic field effect transistors can be produced by a lower temperature process than inorganic semiconductors, a plastic substrate and a film can be used as a substrate and an element that is lightweight and does not break easily can be produced. Moreover, in some cases, an element can be produced by film formation using a method of applying or printing a solution containing an organic material. Furthermore, since there are a wide variety of materials which can be used for the investigation of transistors, material properties can easily be changed fundamentally if materials differing in molecular structure are used. Therefore, it is also possible to realize various, flexible functions, elements, and so on which are impossible with inorganic semiconductors by combining materials differing in function.

In field effect transistors, the voltage applied to a gate electrode acts on a semiconductor layer through a gate insulating layer, thereby controlling on and off of a drain current. Therefore, gate insulating layer materials to be used for organic field effect transistors are required to have properties superior in insulating property and electrical breakdown strength when having been formed into a thin film. Particularly in field effect transistors of a bottom gate type, a semiconductor layer is formed on a gate insulating layer. Therefore, the gate insulating layer material is required also to have such properties as affinity with an organic semiconductor for forming a good interface with the organic semiconductor and a flatness of a film surface that forms an interface with a semiconductor.

Although investigations have been done for various materials with respect to gate insulating layer materials to be used for organic field effect transistors, technologies of utilizing organic materials which need neither high temperature conditions nor complicated equipment for layer formation have recently attracted attentions.

Patent literature 1 discloses the use of an epoxy resin and a silane coupling agent in combination as a gate insulating layer material in an organic thin film transistor. Since problems with the stability of transistor performance are caused if the hygroscopicity of a gate insulating layer material is high, a hydroxyl group formed in a curing reaction of an epoxy resin is made to react with a silane coupling agent in order to solve this problem.

Non-patent literature 1 discloses the use of a resin prepared by thermally cross-linking polyvinylphenol and a melamine compound for a gate insulating layer. By cross-linking with the melamine compound, the hydroxyl groups contained in the polyvinylphenol are removed and the film strength is increased simultaneously. A pentacene TFT having this gate insulating layer has a small hysteresis and exhibits durability to a gate bias stress.

Non-patent literature 2 discloses the use of polyvinylphenol and a copolymer prepared by copolymerizing vinylphenol with methyl methacrylate for a gate insulating layer. The polarity of the whole film is reduced by making the hydroxyl group of vinylphenol interact with the carbonyl group of methyl methacrylate. A pentacene TFT having this gate insulating layer has a small hysteresis and exhibits stable electric properties.

PRIOR ART DOCUMENTS

[Patent Documents]
[Patent Document 1] Japanese Patent Laid-Open Publication No. 2007-305950
[Non-Patent Documents]
[Non-patent Document 1] Appl. Phys. Lett. 89, 093507 (2006)
[Non-patent Document 2] Appl. Phys. Lett. 92, 183306 (2008)

SUMMARY OF THE INVENTION

Problems to be Solved by the Invention

However, in view of utilization, such as driving a light emitting element like an organic electroluminescent element (organic EL element), it is necessary to improve the operation accuracy of an organic thin film transistor, whereas the above-mentioned conventional organic thin film transistor having a gate insulating layer is large in hysteresis.

The purpose of the present invention is to provide an organic thin film transistor that is small in hysteresis.

Means for Solving the Problems

As a result of various investigations in view of the above-mentioned situations, the present invention was accomplished by finding that the hysteresis of an organic thin film transistor could be reduced by forming a gate insulating layer using a specific resin composition containing a fluorine atom and being capable of forming a cross-linked structure. The contact angle of the above-mentioned gate insulating layer with respect to pure water is preferably 91 degrees or more, and more preferably 91 degrees or more and not more than 110 degrees. When the contact angle exceeds 110 degrees, the affinity between an organic material and a metal tends to deteriorate, and it may become difficult to form an organic layer and a wiring layer in contact with the exposed surface of the insulating layer.

The contact angle of the above-mentioned gate insulating layer with respect to pure water is more preferably 91 to 100 degrees, and even more preferably 92 to 96 degrees.

A resin composition useful to the formation of such a gate insulating layer is a resin composition which contains a specific macromolecular compound that contains a fluorine atom and that can form a cross-linked structure.

That is, the present invention provides a resin composition comprising (A) a macromolecule that comprises at least one repeating unit selected from the group consisting of repeating units represented by Formula (1), repeating units represented by Formula (1'), and repeating units represented by Formula (2) and contains two or more first functional groups in its molecule, wherein the first functional group is a functional group that generates, by the action of electromagnetic waves or heat, a second functional group that reacts with active hydrogen, and (B) at least one compound selected from the group consisting of low-molecular compounds containing two or more active hydrogens in each molecule and macromolecules containing two or more active hydrogens in each molecule:

[Chemical Formula 1]

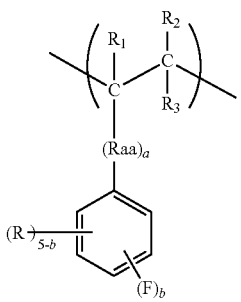

(1)

wherein $R_1$, $R_2$, and $R_3$, which are the same or different, each represent a hydrogen atom, a fluorine atom, or a monovalent organic group having 1 to 20 carbon atoms; R represents a hydrogen atom or a monovalent organic group having 1 to 20 carbon atoms, wherein a hydrogen atom in the monovalent organic group may be substituted with a fluorine atom; Raa represents a divalent organic group having 1 to 20 carbon atoms, wherein a hydrogen atom in the divalent organic group may be substituted with a fluorine atom; a represents an integer of 0 to 20 and b represents an integer of 1 to 5; when there are two or more Raa's, they may be the same or different; and when there are two or more Rs, they may be the same or different,

[Chemical Formula 2]

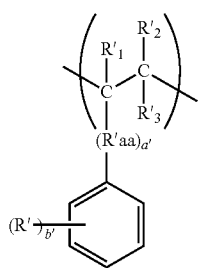

(1')

wherein $R'_1$, $R'_2$, and $R'_3$, which are the same or different, each represent a hydrogen atom, a fluorine atom, or a monovalent organic group having 1 to 20 carbon atoms; R' represents a monovalent organic group having 1 to 20 carbon atoms in which at least one hydrogen atom has been substituted with a fluorine atom; R'aa represents a divalent organic group having 1 to 20 carbon atoms, wherein a hydrogen atom in the divalent organic group may be substituted with a fluorine atom; a' represents an integer of 0 to 20 and b' represents an integer of 1 to 5; when there are two or more R'aa's, they may be the same or different; and when there are two or more R's, they may be the same or different,

[Chemical Formula 3]

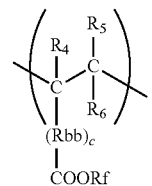

(2)

wherein $R_4$, $R_5$, and $R_6$, which are the same or different, each represent a hydrogen atom, a fluorine atom, or a monovalent organic group having 1 to 20 carbon atoms, wherein a hydrogen atom in the monovalent organic group may be substituted with a fluorine atom; Rf represents a monovalent organic group having 1 to 20 carbon atoms in which at least one hydrogen atom has been substituted with a fluorine atom; Rbb represents a divalent organic group having 1 to 20 carbon atoms, wherein a hydrogen atom in the divalent organic group may be substituted with a fluorine atom; c represents an integer of 0 to 20; when there are two or more Rbb's, they may be the same or different.

In one embodiment, the above-mentioned resin composition is one for an organic thin film transistor gate insulating layer.

In one embodiment, the first functional group is at least one group selected from the group consisting of an isocyanato group blocked by a blocking agent and an isothiocyanato group blocked by a blocking agent.

In one embodiment, the isocyanato group blocked by a blocking agent is a group represented by Formula (3):

[Chemical Formula 4]

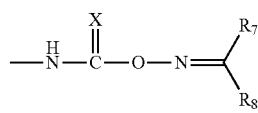

(3)

wherein X represents an oxygen atom or a sulfur atom, and $R_7$ and $R_8$, which are the same or different, each represent a hydrogen atom or a monovalent organic group having 1 to 20 carbon atoms.

In one embodiment, the isothiocyanato group blocked by a blocking agent is a group represented by Formula (4):

[Chemical Formula 5]

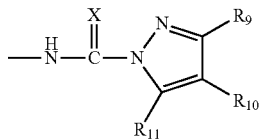

(4)

wherein X represents an oxygen atom or a sulfur atom, and $R_9$, $R_{10}$, and $R_{11}$, which are the same or different, each represent a hydrogen atom or a monovalent organic group having 1 to 20 carbon atoms.

The present invention provides a gate insulating layer of an organic thin film transistor formed with using any one of the above-mentioned resin compositions.

In one embodiment, the above-mentioned gate insulating layer of an organic thin film transistor has a contact angle with respect to pure water of 91 degrees or more.

The present invention provides an organic thin film transistor that has the above-mentioned gate insulating layer.

The present invention provides the above-mentioned organic thin film transistor that is of a bottom-gate/top-contact type or a bottom-gate/bottom-contact type.

The present invention provides a member for a display, wherein the member contains the above-mentioned organic thin film transistor.

The present invention provides a display containing the above-mentioned member for a display.

Effect of the Invention

The gate insulating layer of the present invention is inhibited from causing polarization in the interface of the gate insulating layer even if a gate voltage is applied. As a result, the hysteresis of an organic field effect type transistor lowers. Moreover, the formation of a carrier trapping level is inhibited because there are few polar groups on the surface of the gate insulating layer. As a result, the absolute value of Vth of an organic field effect type transistor lowers.

BRIEF DESCRIPTIONS OF THE DRAWING

[FIG. 1] A schematic cross-sectional diagram illustrating the structure of a bottom-gate/top-contact type organic thin film transistor which is one exemplary embodiment of the present invention.

Figure 2:
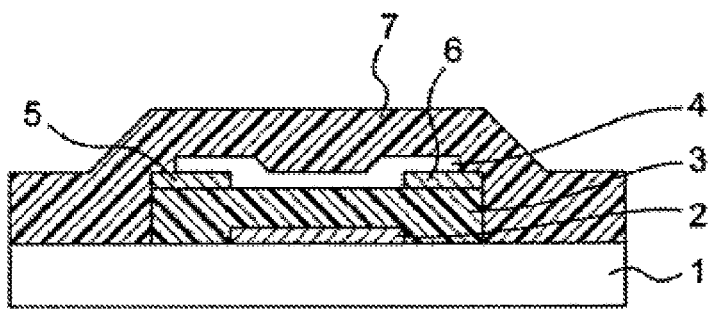

[FIG. 2] A schematic cross-sectional diagram illustrating the structure of a bottom-gate/bottom-contact type organic thin film transistor which is another exemplary embodiment of the present invention.

MODE FOR CARRYING OUT THE INVENTION

The present invention is described in more detail below.

In this specification, a "macromolecular compound" refers to any compound comprising a structure in which two or more identical structural units in a molecule, and this includes a so-called dimer. On the other hand, a "low-molecular compound" means any compound that does not have identical structural units repeatedly in a molecule.

The resin composition for gate insulating layers of the present invention comprises a macromolecule which has a functional group that reacts with active hydrogen when an electromagnetic wave or heat acts and in which a fluorine atom has been introduced (A), and an active hydrogen compound having two or more active hydrogens in a molecule (B). Active hydrogen refers to a hydrogen atom that bonds to an atom other than a carbon atom, such as an oxygen atom, a nitrogen atom, and a sulfur atom.

Macromolecular Compound (A)

The macromolecular compound (A) has a fluorine-substituted organic portion, e.g., a repeating unit containing a fluorine atom. A desirable repeating unit is at least one selected from the group consisting of the above-mentioned repeating units represented by Formula (1), the above-mentioned repeating units represented by Formula (1'), and the above-mentioned repeating units represented by Formula (2).

In the above-mentioned Formula (1), the above-mentioned Formula (1'), and the above-mentioned Formula (2), $R_1$ to $R_6$, and $R'_1$ to $R'_3$, which are the same or different, each represent a hydrogen atom, a fluorine atom, or a monovalent organic group having 1 to 20 carbon atoms. A hydrogen atom in the monovalent organic group may be substituted with a fluorine atom. In one embodiment, all of $R_1$ to $R_6$ and $R'_1$ to $R'_3$ are hydrogen atoms, or $R_4$ is a methyl group and $R_1$ to $R_3$, $R_5$, $R_6$, and $R'_1$ to $R'_3$ are hydrogen atoms. Raa, R'aa, and Rbb each represent a divalent organic group having 1 to 20 carbon atoms. A hydrogen atom in the divalent organic group may be substituted with a fluorine atom. a, a', and c each represent an integer of 0 to 20. In one embodiment, a, a', and c are 0.

R represents a hydrogen atom or a monovalent organic group having 1 to 20 carbon atoms. A hydrogen atom in the monovalent organic group may be substituted with a fluorine atom. R' represents a monovalent organic group having 1 to 20 carbon atoms in which at least one hydrogen atom has been substituted with a fluorine atom. b and b' each represent an integer of 1 to 5. In one embodiment, b is 5 and b' is 1.

Rf represents a monovalent organic group having 1 to 20 carbon atoms in which at least one hydrogen atom has been substituted with a fluorine atom. In one embodiment, Rf is a 2,2,2-trifluoroethyl group, a 2,2,3,3,3-pentafluoropropyl group, or a 2-(perfluorobutyl)ethyl group.

The monovalent organic group having 1 to 20 carbon atoms may be linear, branched, or cyclic and also may be saturated or unsaturated.

Examples of the monovalent organic group having 1 to 20 carbon atoms include linear hydrocarbon groups having 1 to 20 carbon atoms, branched hydrocarbon groups having 3 to 20 carbon atoms, cyclic hydrocarbon groups having 3 to 20 carbon atoms, and aromatic hydrocarbon groups having 6 to 20 carbon atoms, preferred examples include linear hydrocarbon groups having 1 to 6 carbon atoms, branched hydrocarbon groups having 3 to 6 carbon atoms, cyclic hydrocarbon groups having 3 to 6 carbon atoms, and aromatic hydrocarbon groups having 6 to 20 carbon atoms.

As to the linear hydrocarbon groups having 1 to 20 carbon atoms, the branched hydrocarbon groups having 3 to 20 carbon atoms, and the cyclic hydrocarbon groups having 3 to 20 carbon atoms, each of the hydrogen atoms contained in these groups may be substituted with a fluorine atom.

As to the aromatic hydrocarbon groups having 6 to 20 carbon atoms, each of the hydrogen atoms in the groups may be substituted with an alkyl group, a halogen atom, or the like.

Specific examples of the monovalent organic group having 1 to 20 carbon atoms include a methyl group, an ethyl group, a propyl group, a butyl group, a pentyl group, a hexyl group, an isopropyl group, an isobutyl group, a tertiary butyl group, a cyclopropyl group, a cyclobutyl group, a cyclopentyl group, a cyclohexyl group, a cyclopentynyl group, a cyclohexynyl group, a trifluoromethyl group, a trifluoroethyl group, a phenyl group, a naphthyl group, an anthryl group, a tolyl group, a xylyl group, a dimethylphenyl group, a trimethylphenyl group, an ethylphenyl group, a diethylphenyl group, a triethylphenyl group, a propylphenyl group, a butylphenyl group, a methylnaphthyl group, a dimethylnaphthyl group, a trimethylnaphthyl group, a vinylnaphthyl group, an ethenylnaphthyl group, a methyl anthryl group, an ethylanthryl group, a pentafluorophenyl group, a trifluoromethylphenyl group, a chlorophenyl group, and a bromophenyl group.

An alkyl group is preferred as the monovalent organic group having 1 to 20 carbon atoms.

The divalent organic group having 1 to 20 carbon atoms may be linear, branched, or cyclic; examples thereof include linear aliphatic hydrocarbon groups having 1 to 20 carbon atoms, branched aliphatic hydrocarbon groups having 3 to 20 carbon atoms, alicyclic hydrocarbon groups having 3 to 20 carbon atoms, and aromatic hydrocarbon groups having 6 to 20 carbon atoms that may be substituted with an alkyl group or the like, and linear hydrocarbon group having 1 to 6 carbon atoms, branched hydrocarbon group having 3 to 6 carbon atoms, cyclic hydrocarbon group having 3 to 6 carbon atoms, and aromatic hydrocarbon groups having 6 to 20 carbon atoms that may be substituted with an alkyl group or the like are preferred.

Specific examples of the aliphatic hydrocarbon groups include a methylene group, an ethylene group, a propylene group, a butylene group, a pentylene group, a hexylene group, an isopropylene group, an isobutylene group, a dimethylpropylene group, a cyclopropylene group, a cyclobutylene group, a cyclopentylene group, and a cyclohexylene group.

Specific examples of the aromatic hydrocarbon groups having 6 to 20 carbon atoms include a phenylene group, a naphthylene group, an anthrylene group, a dimethylphenylene group, a trimethylphenylene group, an ethylenephenylene group, a diethylenephenylene group, a triethylenephenylene group, a propylenephenylene group, a butylenephenylene group, a methylnaphthylene group, a dimethylnaphthylene group, a trimethylnaphthylene group, a vinylnaphthylene group, an ethenylnaphthylene group, a methylanthrylene group, and an ethylanthrylene group.

Preferred examples of the repeating unit represented by Formula (1), the repeating unit represented by Formula (1'), and the repeating unit represented by Formula (2) are the following repeating units.

[Chemical Formula 6]

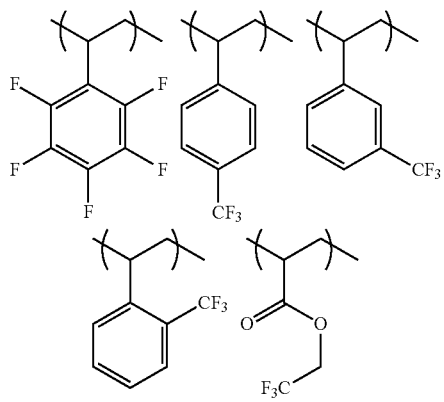

The macromolecular compound (A) has a functional group that reacts with active hydrogen when an electromagnetic wave or heat acts thereon. When the above-mentioned functional group which the macromolecular compound (A) has is referred to as a first functional group, the first functional group does not react with active hydrogen, but if an electromagnetic wave or heat acts on the first functional group, a second functional group is generated and this reacts with active hydrogen. That is, the first functional group is a functional group that is deprotected with an electromagnetic wave or heat to generate a second functional group that reacts with active hydrogen. The second functional group is protected (blocked) until an electromagnetic wave or heat is applied in the step of forming a gate insulating layer to be present in the resin composition as the first functional group. As a result, the storage stability of the resin composition will improve.

Examples of the first functional group include an isocyanato group blocked by a blocking agent or an isothiocyanato group blocked by a blocking agent.

The aforementioned isocyanato group blocked by a blocking agent or the blocked isothiocyanato group can be produced by making a blocking agent having only one active hydrogen capable of reacting with an isocyanato group or an isothiocyanato group in one molecule react with an isocyanato group or an isothiocyanato group.

As the aforementioned blocking agent, one that dissociates at a temperature of 170° C. or lower even after reacting with an isocyanato group or an isothiocyanato group is preferred. Examples of the blocking agent include alcohol type compounds, phenol type compounds, active methylene type compounds, mercaptan type compounds, acid amide type compounds, acid imide type compounds, imidazole type compounds, urea type compounds, oxime type compounds, amine type compounds, imine type compounds, bisulfites, pyridine type compounds, and pyrazole type compounds. These may be used singly or two or more of them may be used in admixture. Preferred are oxime type compounds and pyrazole type compounds.

Specific blocking agents include alcohol type compounds, such as methanol, ethanol, propanol, butanol, 2-ethylhexanol, methylcellosolve, butylcellosolve, methylcarbitol, benzyl alcohol, and cyclohexanol. Examples of the phenol type compounds include phenol, cresol, ethylphenol, butylphenol, nonylphenol, dinonylphenol, styrenated phenol, and hydroxybenzoic acid esters. Examples of the active methylene type compounds include dimethyl malonate, diethyl malonate, methyl acetoacetate, ethyl acetoacetate, and acetylacetone. Examples of the mercaptan type compounds include butyl mercaptan and dodecylmercaptan. Examples of the acid amide type compounds include acetanilide, amide acetate, ε-caprolactam, δ-valerolactam, γ-butyrolactam, examples of the acid imide type compounds include succinimide and maleimide. Examples of the imidazole type compounds include imidazole and 2-methylimidazole. Examples of the urea type compounds include urea, thiourea, and ethyleneurea. Examples of the amine type compounds include diphenylamine, aniline, and carbazole. Examples of the imine type compounds include ethyleneimine and polyethyleneimine. Examples of the bisulfites include sodium bisulfite. Examples of the pyridine type compounds include 2-hydroxypyridine and 2-hydroxyquinoline. Examples of the oxime type compounds include formaldoxime, acetaldoxime, acetoxime, methylethylketoxime, and cyclohexanone oxime. Examples of the pyrazole type compounds include 3,5-dimethylpyrazole and 3,5-diethylpyrazole.

Groups represented by the following Formula (3) or Formula (4) are preferred as the isocyanato group or isothiocyanato group blocked by a blocking agent which may be used for the present invention.

[Chemical Formula 7]

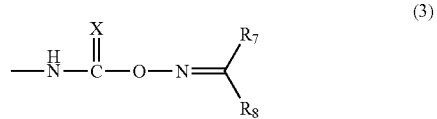

(3)

[Chemical Formula 8]

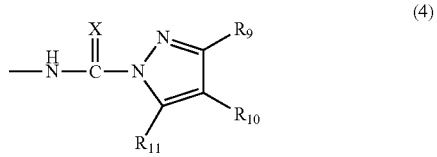

(4)

In Formula (3) and Formula (4), X represents an oxygen atom or a sulfur atom, and $R_7$ to $R_{11}$, which are the same or different, each represent a hydrogen atom or a monovalent organic group having 1 to 20 carbon atoms. The definition, specific examples, and so on of the monovalent organic group are the same as the definition, the specific examples, and so on of the above-mentioned monovalent organic groups in $R_1$ to $R_6$. In one embodiment, $R_7$ and $R_8$ are each independently a group selected from the group consisting of a methyl group and an ethyl group, and $R_9$ to $R_{11}$ are hydrogen atoms.

Examples of the isocyanato group blocked by a blocking agent include an O-(methylideneamino)carboxyamino group, an O-(1-ethylideneamino)carboxyamino group, an O-(1-methylethylideneamino)carboxyamino group, an O-[1-methylpropylideneamino]carboxyamino group, an (N-3,5-dimethylpyrazolylcarbonyl)amino group, an (N-3-ethyl-5-methylpyrazolylcarbonyl)amino group, an (N-3,5-diethylpyrazolylcarbonyl)amino group, an (N-3-propyl-5-methylpyrazolylcarbonyl)amino group, and an (N-3-ethyl-5-propylpyrazolylcarbonyl)amino group.

Examples of the isothiocyanato group blocked by a blocking agent include an O-(methylideneamino)thiocarboxyamino group, an O-(1-ethylideneamino)thiocarboxyamino group, an O-(1-methylethylideneamino) thiocarboxyamino group, an O-[1-methylpropylideneamino] thiocarboxyamino group, an (N-3,5-dimethylpyrazolylthiocarbonyl)amino group, an (N-3-ethyl-5-methylpyrazolylthiocarbonyl)amino group, an (N-3,5-diethylpyrazolylthiocarbonyl)amino group, an (N-3-propyl-5-methylpyrazolylthiocarbonyl)amino group, and an (N-3-ethyl-5-propylpyrazolylthiocarbonyl)amino group.

An isocyanato group blocked by blocking agent is preferred as the first functional group to be used in the present invention.

The macromolecular compound (A) can be produced by, for example, a method of copolymerizing a polymerizable monomer that serves as a raw material of a repeating unit represented by Formula (1) or a polymerizable monomer that serves as a raw material of a repeating unit represented by Formula (1'), a polymerizable monomer that serves as a raw material of a repeating unit represented by Formula (2), and a polymerizable monomer containing a first functional group using a photopolymerization initiator or a thermal polymerization initiator.

Examples of the polymerizable monomer to be used as a raw material of a repeating unit represented by Formula (1) and examples of the polymerizable monomer to be used as a raw material of the repeating unit represented by Formula (1') include 4-trifluoromethylstyrene, 2,3,4,5,6-pentafluorostyrene, and 4-fluoromethylstyrene.

Examples of the polymerizable monomer to be used as a raw material of a repeating unit represented by the formula (2) include 2,2,2-trifluoroethyl acrylate, 2,2,3,3,3-pentafluoropropyl acrylate, 2-(perfluorobutyl)ethyl acrylate, 3-perfluorobutyl-2-hydroxypropyl acrylate, 2-(perfluorohexyl)ethyl acrylate, 3-perfluorohexyl-2-hydroxypropyl acrylate, 2-(perfluorooctyl)ethyl acrylate, 3-perfluorooctyl-2-hydroxypropyl acrylate, 2-(perfluorodecyl)ethyl acrylate, 2-(perfluoro-3-methylbutyl)ethyl acrylate, 3-(perfluoro-3-methylbutyl)-2-hydroxypropyl acrylate, 2-(perfluoro-5-methylhexyl)ethyl acrylate, 2-(perfluoro-3-methylbutyl)-2-hydroxypropyl acrylate, 3-(perfluoro-5-methylhexyl)-2-hydroxypropyl acrylate, 2-(perfluoro-7-methyloctyl)ethyl acrylate, 3-(perfluoro-7-methyloctyl)-2-hydroxypropyl acrylate, 1H,1H,3H-tetrafluoropropylacrylate, 1H,1H,5H-octafluoropentyl acrylate, 1H,1H,7H-dodecafluoroheptyl acrylate, 1H,1H,9H-hexadecafluorononyl acrylate, 1H-1-(trifluoromethyl)trifluoroethyl acrylate, 1H,1H,3H-hexafluorobutyl acrylate, 2,2,2-trifluoroethyl methacrylate, 2,2,3,3,3-pentafluoropropyl methacrylate, 2-(perfluorobutyl)ethyl methacrylate, 3-perfluorobutyl-2-hydroxypropyl methacrylate, 2-(perfluorohexyl)ethyl methacrylate, 3-perfluorohexyl-2-hydroxypropyl methacrylate, 2-(perfluorooctyl)ethyl methacrylate, 3-perfluorooctyl-2-hydroxypropyl methacrylate, 2-(perfluorodecyl)ethyl methacrylate, 2-(perfluoro-3-methylbutyl)ethyl methacrylate, 3-(perfluoro-3-methylbutyl)-2-hydroxypropyl methacrylate, 2-(perfluoro-5-methylhexyl)ethyl methacrylate, 2-(perfluoro-3-methylbutyl)-2-hydroxypropyl methacrylate, 3-(perfluoro-5-methylhexyl)-2-hydroxypropyl methacrylate, 2-(perfluoro-7-methyloctyl) ethyl methacrylate, 3-(perfluoro-7-methyloctyl)-2-hydroxypropyl methacrylate, 1H, 1H, 3H-tetrafluoropropyl methacrylate, 1H, 1H, 5H-octafluoropentyl methacrylate, 1H,1H,7H-dodecafluoroheptyl methacrylate, 1H,1H,9H-hexadecafluorononyl methacrylate, 1H-1-(trifluoromethyl)trifluoroethyl methacrylate, and 1H,1H,3H-hexafluorobutyl methacrylate.

Examples of the polymerizable monomer containing the first functional group include monomers having in a molecule an isocyanato group blocked by a blocking agent or an isothiocyanato group blocked by a blocking agent, and an unsaturated bond. The monomers having in a molecule an isocyanato group blocked by a blocking agent or an isothiocyanato group blocked by a blocking agent, and an unsaturated bond can be produced by making a compound having in the molecule thereof an isocyanato group or an isothiocyanato group and an unsaturated bond react with a blocking agent. An unsaturated double bond is preferred as the unsaturated bond.

Examples of the compound having an unsaturated double bond and an isocyanato group in the molecule thereof include 2-acryloyloxyethylisocyanate, 2-methacryloyloxyethylisocyanate, and 2-(2'-methacryloyloxyethyl)oxyethylisocyanate. Examples of the compound having an unsaturated double bond and an isothiocyanato group in the molecule thereof include 2-acryloyloxyethylisothiocyanate, 2-methacryloyloxyethylisothiocyanate, and 2-(2'-methacryloyloxyethyl) oxyethylisothiocyanate.

The aforementioned blocking agents can be used suitably as the blocking agent, and an organic solvent, a catalyst, and so on can be added according to need.

Examples of the aforementioned monomer having in the molecule thereof an unsaturated double bond and an isocyanato group blocked by a blocking agent include 2-[O-[1'-methylpropylideneamino]carboxyamino]ethyl methacrylate, and 2-[N-[1',3'-dimethylpyrazolyl]carboxyamino]ethyl methacrylate.

Examples of the photopolymerization initiator include carbonyl compounds, such as acetophenone, 2,2-dimethoxy-2-phenylacetophenone, 2,2-diethoxyacetophenone, 4-isopropyl-2-hydroxy-2-methylpropiophenone, 2-hydroxy-2-methylpropiophenone, 4,4'-bis(diethylamino) benzophenone, benzophenone, methyl(o-benzoyl) benzoate, 1-phenyl-1,2-propanedione-2-(o-ethoxycarbonyl)oxime, 1-phenyl-1,2-propanedione-2-(o-benzoyl)oxime, benzoin, benzoin methyl ether, benzoin ethyl ether, benzoin isopropyl ether, benzoin isobutyl ether, benzoin octyl ether, benzil, benzyl dimethyl ketal, benzyl diethyl ketal, and diacetyl; derivatives of anthraquinone or thioxanthone, such as methylanthraquinone, chloroanthraquinone, chlorothioxanthone, 2-methylthioxanthone, and 2-isopropylthioxanthone; and sulfur compounds, such as diphenyldisulfide and dithiocarbamate.

The thermal polymerization initiator may be any substance that can serve as an initiator of radical polymerization, and examples thereof include azo type compounds, such as 2,2'-azobisisobutyronitrile, 2,2'-azobisisovaleronitrile, 2,2'-azobis(2,4-dimethylvaleronitrile), 4,4'-azobis(4-cyanovaleric acid), 1,1'-azobis(cyclohexanecarbonitrile), 2,2'-azobis (2-methylpropane), and 2,2'-azobis(2-methylpropionamidine) dihydrochloride; ketone peroxides, such as methyl ethyl ketone peroxide, methyl isobutyl ketone peroxide, cyclohexanone peroxide, and acetylacetone peroxide; diacyl peroxides, such as isobutyl peroxide, benzoyl peroxide, 2,4-dichlorobenzoyl peroxide, o-methylbenzoyl peroxide, lauroyl peroxide, and p-chlorobenzoyl peroxide; hydroperoxides, such as 2,4,4-trimethylpentyl-2-hydroperoxide, diisopropylbenzene peroxide, cumene hydroperoxide, and tert-butyl peroxide; dialkyl peroxides, such as dicumyl peroxide, tert-butylcumyl peroxide, di-tert-butyl peroxide, and tris(tert-butyl peroxide)triazine; peroxyketals, such as 1,1-di-tert-butylperoxycyclohexane and 2,2-di(tert-butyl peroxy)butane; alkyl peroxyesters, such as tert-butyl peroxypivalate, tert-butyl peroxy-2-ethylhexanoate, tert-butyl peroxyisobutylate, di-tert-butyl peroxyhexahydroterephthalate, di-tert-butyl peroxyazelate, tert-butyl peroxy-3,5,5-trimethylhexanoate, tert-butyl peroxyacetate, tert-butyl peroxybenzoate, and di-tert-butyl peroxytrimethyladipate; and peroxycarbonates, such as diisopropyl peroxydicarbonate, di-sec-butyl peroxydicarbonate, and tert-butyl peroxyisopropylcarbonate.

The macromolecular compound to be used for the present invention may be produced also by adding other polymerizable monomer other than the polymerizable monomer that serves as a raw material of a repeating unit represented by Formula (1) provided above, the polymerizable monomer that serves as a raw material of a repeating unit represented by Formula (1') provided above, the polymerizable monomer that serves as a raw material of a repeating unit represented by Formula (2) provided above, and the polymerizable monomer having the functional group at the time of polymerization.

Examples of the other polymerizable monomer include acrylates and their derivatives, methacrylates and their derivatives, styrene and its derivatives, vinyl acetate and its derivatives, methacrylonitrile and its derivatives, acrylonitrile and its derivatives, vinyl esters of organic carboxylic acids and their derivatives, allyl esters of organic carboxylic acids and their derivatives, dialkyl esters of fumaric acid and their derivatives, dialkyl esters of maleic acid and their derivatives, dialkyl esters of itaconic acid and their derivatives, N-vinylamide derivatives of organic carboxylic acids, maleimide and its derivatives, terminal unsaturated hydrocarbons and their derivatives, and organic germanium derivatives.

The kind of the other polymerizable monomer is appropriately chosen according to the property that the gate insulating layer is required to have. When priority is given to superior durability or small hysteresis, a monomer that is high in molecular density and that can form a hard film like styrene and styrene derivatives is chosen. When priority is given to adhesiveness to an adjacent surface such as the surface of a gate electrode or a substrate, a monomer capable of imparting flexibility like methacrylates and their derivatives, acrylates and their derivatives is chosen. In one preferable embodiment, a monomer having no active hydrogen-containing group like alkyl groups, such as a methyl group and an ethyl group, is chosen.

By the use of, for example, the polymerizable monomer that serves as a raw material of a repeating unit represented by Formula (1) provided above or the polymerizable monomer that serves as a raw material of a repeating unit represented by Formula (1') provided above in combination with styrene or a styrene derivative having no active hydrogen-containing group, a gate insulating layer that is particularly high in durability and is small in hysteresis can be obtained.

As the acrylates and their derivatives, there can be used monofunctional acrylates and multifunctional acrylates, of which amount to be used is limited, and examples thereof include methyl acrylate, ethyl acrylate, n-propyl acrylate, isopropyl acrylate, n-butyl acrylate, isobutyl acrylate, sec-butyl acrylate, hexyl acrylate, octyl acrylate, 2-ethylhexyl acrylate, decyl acrylate, isobornyl acrylate, cyclohexyl acrylate, phenyl acrylate, benzyl acrylate, 2-hydroxyethyl acrylate, 2-hydroxypropyl acrylate, 3-hydroxypropyl acrylate, 2-hydroxybutyl acrylate, 2-hydroxyphenylethyl acrylate, ethylene glycol diacrylate, propylene glycol diacrylate, 1,4-butanediol diacrylate, diethylene glycol diacrylate, triethylene glycol diacrylate, trimethylolpropane diacrylate, trimethylolpropane triacrylate, pentaerythritol pentaacrylate, N,N-dimethylacrylamide, N,N-diethylacrylamide, and N-acryloylmorpholine.

As the methacrylates and their derivatives, there can be used monofunctional methacrylates and multifunctional methacrylates, of which amount to be used is limited, and examples thereof include methyl methacrylate, ethyl methacrylate, n-propyl methacrylate, isopropyl methacrylate, n-butyl methacrylate, isobutyl methacrylate, sec-butyl methacrylate, hexyl methacrylate, octyl methacrylate, 2-ethylhexyl methacrylate, decyl methacrylate, isobornyl methacrylate, cyclohexyl methacrylate, phenyl methacrylate, benzyl methacrylate, 2-hydroxyethyl methacrylate, 2-hydroxypropyl methacrylate, 3-hydroxypropyl methacrylate, 2-hydroxybutyl methacrylate, 2-hydroxyphenylethyl methacrylate, ethylene glycol dimethacrylate, propylene glycol dimethacrylate, 1,4-butanediol dimethacrylate, diethylene glycol dimethacrylate, triethylene glycol dimethacrylate, trimethylolpropane dimethacrylate, trimethylolpropane trimethacrylate, pentaerythritol pentamethacrylate, N,N-dimethylmethacrylamide, N,N-diethylmethacrylamide, and N-acryloylmorpholine.

Examples of styrene and its derivatives include styrene, 2,4-dimethyl-α-methylstyrene, o-methylstyrene, m-methylstyrene, p-methylstyrene, 2,4-dimethylstyrene, 2,5-dimethylstyrene, 2,6-dimethylstyrene, 3,4-dimethylstyrene, 3,5-dimethylstyrene, 2,4,6-trimethylstyrene, 2,4,5-trimethylstyrene, pentamethylstyrene, o-ethylstyrene, m-ethylstyrene, p-ethylstyrene, o-chlorostyrene, m-chlorostyrene, p-chlorostyrene, o-bromostyrene, m-bromostyrene, p-bromostyrene, o-methoxystyrene, m-methoxystyrene, p-methoxystyrene, o-hydroxystyrene, m-hydroxystyrene, p-hydroxystyrene, 2-vinylbiphenyl, 3-vinylbiphenyl, 4-vinylbiphenyl, 1-vinylnaphthalene, 2-vinylnaphthalene, 4-vinyl-p-terphenyl, 1-vinylanthracene, α-methylstyrene, o-isopropenyltoluene, m-isopropenyltoluene, p-isopropenyltoluene, 2,4-dimethyl-α-methylstyrene, 2,3-dimethyl-α-methylstyrene, 3,5-dimethyl-α-methylstyrene, p-isopropyl-α-methylstyrene, α-ethylstyrene, α-chlorostyrene, divinylbenzene, divinylbiphenyl, diisopropylbenzene, and 4-aminostyrene.

Acrylic nitriles and its derivatives include acrylonitrile, and so on. Methacrylic nitriles and its derivatives include methacrylonitrile, and so on.

Examples of the vinyl esters of organic carboxylic acids and their derivatives include vinyl acetate, vinyl propionate, vinyl butyrate, vinyl benzoate, and divinyl adipate.

Examples of the allyl esters of organic carboxylic acids and their derivatives include allyl acetate, allyl benzoate, diallyl adipate, diallyl terephthalate, diallyl isophthalate, and diallyl phthalate.

Examples of the dialkyl esters of fumaric acid and their derivatives include dimethyl fumarate, diethyl fumarate, diisopropyl fumarate, di-sec-butyl fumarate, diisobutyl fumarate, di-n-butyl fumarate, di-2-ethylhexyl fumarate, and dibenzyl fumarate.

Examples of the dialkyl esters of maleic acid and their derivatives include dimethyl maleate, diethyl maleate, diisopropyl maleate, di-sec-butyl maleate, diisobutyl maleate, di-n-butyl maleate, di-2-ethylhexyl maleate, and dibenzyl maleate.

Examples of the dialkyl esters of itaconic acid and their derivatives include dimethyl itaconate, diethyl itaconate, diisopropyl itaconate, di-sec-butyl itaconate, di-isobutyl itaconate, di-n-butyl itaconate, di-2-ethylhexyl itaconate, and dibenzyl itaconate.

Examples of the N-vinylamide derivatives of organic carboxylic acids include N-methyl-N-vinylacetamide.

Examples of maleimide and its derivative include N-phenylmaleimide and N-cyclohexylmaleimide.

Examples of the terminal unsaturated hydrocarbons and their derivatives include 1-butene, 1-pentene, 1-hexene, 1-octene, vinylcyclohexane, vinyl chloride, and allyl alcohol.

Examples of the organic germanium derivatives include allyltrimethylgermanium, allyltriethylgermanium, allyltributylgermanium, trimethylvinylgermanium, and triethylvinylgermanium.

Among these, alkyl acrylates, alkyl methacrylates, styrene, acrylonitrile, methacrylonitrile, and allyltrimethylgermanium are preferred.

The amounts to be used of the polymerizable monomer that serves as a raw material of a repeating unit represented by Formula (1) provided above, the polymerizable monomer that serves as a raw material of a repeating unit represented by Formula (1') provided above, or the polymerizable monomer that serves as a raw material of a repeating unit represented by Formula (2) provided above are adjusted so that the amount of fluorine to be introduced to the macromolecular compound (A) may become an appropriate amount.

The amount of fluorine to be introduced to the macromolecular compound (A) is preferably 1 to 60% by weight, more preferably 5 to 50% by weight, and even more preferably 5 to 40% by weight relative to the weight of the macromolecular compound. When the amount of fluorine is less than 1% by weight, the effect of reducing the hysteresis of an organic field effect transistor may become insufficient, and when it exceeds 60% by weight, the affinity with an organic semiconductor material deteriorates, so that it may become difficult to laminate an active layer on it.

The molar ratio of the charged monomer having an unsaturated double bond and an isocyanato group blocked by a blocking agent or an isothiocyanato group blocked by a blocking agent to all the monomers which are involved in any polymerization is preferably 5 mol % or more and 60% or less, and more preferably 10 mol % or more and 50 mol % or less. By adjusting the charged molar ratio of the above-mentioned monomer within this range, a cross-linked structure is formed sufficiently inside the gate insulating layer, the content of polar groups is maintained at a low level, and the polarization of a gate insulating layer is inhibited.

The macromolecular compound (A) preferably has a weight average molecular weight of 3000 to 1000000, more preferably 5000 to 500000 and it may be in a linear form, a branched form, or a cyclic form.

Fluorine atoms have been introduced in the repeating unit represented by Formula (1), the repeating unit represented by Formula (1'), and the repeating unit represented by Formula (2) that constitute the macromolecular compound (A) and the groups do not have any active hydrogen-containing group like a hydroxyl group. Therefore, it is thought that a gate insulating layer to be formed as a whole is low in polarity and contains little components which are polarized easily when a gate voltage is applied, so that the polarization of the gate insulating layer is inhibited. If the polarization of a gate insulating layer is inhibited, the hysteresis of an organic field effect transistor is deteriorated and operation accuracy is improved.

Examples of macromolecules capable of being used for the present invention containing at least one kind of repeating unit selected from the group consisting of the aforementioned repeating units represented by Formula (1), the aforementioned repeating units represented by Formula (1') and the aforementioned repeating units represented by Formula (2) and containing in a molecule thereof two or more first functional groups that generate, by electromagnetic waves or heat, second functional groups capable of reacting with active hydrogen include
poly(styrene-co-pentafluorostyrene-co-[2-[O-(1'-methylpropylideneamino)carboxyamino]ethyl-methacrylate]), poly(styrene-co-pentafluorostyrene-co-[2-[1'-(3',5'-dimethylpyrazolyl)carboxyamino]ethyl-methacrylate]), poly(styrene-co-pentafluorostyrene-co-acrylonitrile-co-[2-[O-(1'-methylpropylideneamino)carboxyamino]ethyl-methacrylate]), poly(styrene-co-pentafluorostyrene-co-acrylonitrile-co-[2-[1'-(3',5'-dimethylpyrazolyl)carboxyamino]ethyl-methacrylate]), poly(styrene-co-pentafluorostyrene-co-acrylonitrile-co-[2-[O-(1'-methylpropylideneamino)carboxyamino]ethyl-methacrylate]-co-allytrimethylgermanium), poly(styrene-co-pentafluorostyrene-co-acrylonitrile-co-[2-[1'-(3',5'-dimethylpyrazolyl)carboxyamino]ethyl-methacrylate]-co-allytrimethylgermanium), poly(methyl methacrylate-co-pentafluorostyrene-co-[2-[O-(1'-methylpropylideneamino)carboxyamino]ethyl-methacrylate]), poly(methylmethacrylate-co-pentafluorostyrene-co-[2-[1'-(3',5'-dimethylpyrazolyl)carboxyamino]ethyl-methacrylate]), poly(styrene-co-(2,2,2-trifluoroethylmethacrylate)-co-[2-[O-(1'-methylpropylideneamino)carboxyamino]ethyl-methacrylate]), poly(styrene-co-(2,2,2-trifluoroethylmethacrylate)-co-[2-[1'-(3',5'-dimethylpyrazolyl)carboxyamino]ethyl-methacrylate]), poly(styrene-co-4-trifluoromethylstyrene-co-[2-[O-(1'-methylpropylideneamino)carboxylamino]ethyl-methacrylate]).

Active Hydrogen Compound (B)

The active hydrogen compounds (B) is, for example, a low-molecular compound that has two or more active hydrogens in the molecule thereof or a macromolecular compound that has two or more active hydrogens in the molecule thereof. Typical examples of active hydrogen include hydrogen atoms contained in an amino group, a hydroxyl group, or a mercapto group. Hydrogens contained in the aforementioned reactive functional groups, especially, the hydroxyl group in a phenolic hydroxyl group that can well occur a reaction with an isocyanato group or an isothiocyanato group and hydrogens contained in the amino group in an aromatic amino group are suitable as active hydrogen.

Specific examples of the low-molecular compound include compounds each having a structure in which two or more active hydrogen-containing groups bond to a low molecule (monomer) structure. Examples of the low molecule structure include an alkyl structure and a benzene ring structure. Specific examples of the low-molecular compound include low-molecular compounds such as amine type compounds, alcohol type compounds, phenol type compounds, and thiol type compounds.

Examples of the amine type compounds include ethylenediamine, propylenediamine, hexamethylenediamine, N,N,N',N'-tetraminoethylethylenediamine, ortho-phenylenediamine, meta-phenylenediamine, para-phenylenediamine, N,N'-diphenyl-p-phenylenediamine, melamine, 2,4,6-triaminopyrimidine, 1,5,9-triazacyclododecane, 1,3-bis(3-aminopropyl)tetramethyldisiloxane, 1,4-bis(3-aminopropyldimethylsilyl)benzene, 3-(2-aminoethylaminopropyl)tris(trimethylsiloxy)silane, 1,3-bis(3'-aminophenoxy)benzene, 2,2-ditrifluoromethylbenzidine, 1,3-bis(3-aminopropyl)-1,1,3,3-tetramethyldisiloxane, 1,4-bis(3-aminopropyldimethylsilyl)benzene, and 3-(2-aminoethylaminopropyl)tris(trimethylsiloxy)silane.

Examples of the alcohol type compounds include ethylene glycol, 1,2-dihydroxypropane, glycerol, and 1,4-dimethanolbenzene. Examples of the phenol type compounds include 1,2-dihydroxybenzene, 1,3-dihydroxybenzene, 1,4-dihydroxybenzene, 1,2-dihydroxynaphthalene, resorcinol, fluoroglycerol, 2,3,4-trihydroxybenzaldehyde, 3,4,5-trihydroxybenzamide, and di(4-hydroxy-3-nitrophenyl)ether. Moreover, examples of the thiol type compounds include ethylene dithiol and para-phenylene dithiol.

On the other hand, in the macromolecular compound, active hydrogen may be attached directly to a main chain constituting the macromolecular compound or may be attached via a prescribed group. Moreover, active hydrogen may be contained in structural units constituting a macromolecular compound, and in such a case, active hydrogen may be contained in every structural unit or may be contained only in some structural units. Furthermore, active hydrogen may be combined only at terminals of a macromolecular compound.

Specific examples of the macromolecular compound include compounds each having a structure in which two or more active hydrogen-containing groups bond to a macromolecule (polymer) structure. Such a macromolecular compound can be obtained by forming a polymer by polymerizing a monomeric compound (monomer) having an active hydrogen-containing group and an unsaturated bond such as a double bond in the molecule thereof singly or copolymerizing it with other copolymerizable compounds. A photopolymerization initiator or a thermal polymerization initiator may be applied in such polymerization. As the polymerizable monomer, the photopolymerization initiator, and the thermal polymerization initiator, substances the same as those mentioned above can be applied.

Examples of the monomer having an active hydrogen-containing group and an unsaturated bond in the molecule thereof include aminostyrene, hydroxystyrene, vinylbenzyl alcohol, aminoethyl methacrylate, and ethylene glycol monovinyl ether.

A novolac resin obtained by condensing a phenol compound and formaldehyde in the presence of an acid catalyst is also preferred as a macromolecular compound. Moreover, a polysilsesquioxane compound obtained by condensing an organosilicon compound in the presence of an acid catalyst is also preferred as a macromolecular compound. Examples of the polysilsesquioxane compound include
poly{dimethyl-2-(4'-hydroxyphenyl)ethylsilylsilsesquioxane}.

The polystyrene-equivalent weight average molecular weight of a macromolecular compound having two or more active hydrogen-containing groups in the molecule thereof is preferably 1000 to 1000000, and more preferably 3000 to 500000. This makes it possible to obtain the effect that the planarity and the uniformity of an insulating layer become good.

Resin Composition for Gate Insulation

A resin composition for a gate insulating layer is obtained by mixing a macromolecular compound (A) and an active hydrogen compound (B). The mixing proportion of the two compounds is adjusted so that the molar ratio of macromolecular compound (A)'s functional group that reacts with active hydrogen to active hydrogen-containing compound (B)'s active hydrogen-containing group may become preferably from 60/100 to 150/100, more preferably from 70/100 to 120/100, and even more preferably from 90/100 to 110/100. When the ratio is less than 60/100, there is excessive active hydrogen, so that the effect of reducing hysteresis may deteriorate, and when it exceeds 150/100, there are excessive functional groups capable of reacting with active hydrogen, so that the absolute value of threshold voltage may become large.

The resin composition for a gate insulating layer may be made to contain, for example, a solvent for mixing of viscosity modification and an additive that is usually used in combination with a cross-linking agent when cross-linking resin. The solvent to be used is an ether type solvent, such as tetrahydrofuran and diethyl ether, an aliphatic hydrocarbon type solvent, such as hexane, a alicyclic hydrocarbon type solvent, such as cyclohexane, an unsaturated hydrocarbon type solvent, such as pentene, an aromatic hydrocarbon type solvent, such as xylene, a ketone type solvent, such as acetone, an acetate type solvent, such as butyl acetate, an alcohol type solvent, such as isopropanol, a halogen type solvent, such as chloroform, or a mixed solvent thereof. As the additive there can be used a catalyst for promoting a cross-linking reaction, a leveling agent, a viscosity modifier, and so on.

Organic Thin Film Transistor

FIG. 1 is a schematic cross-sectional diagram illustrating the structure of a bottom-gate/top-contact type organic thin film transistor which is one exemplary embodiment of the present invention. This organic thin film transistor has a substrate 1, a gate electrode 2 formed on the substrate 1, a gate insulating layer 3 formed on the gate electrode 2, an organic semiconductor layer 4 formed on the gate insulating layer 3, a source electrode 5 and a drain electrode 6 formed across a channel portion on the organic semiconductor layer 4, and an overcoat 7 covering the whole body of the device.

Bottom-gate/top-contact type organic thin film transistors can be produced by, for example, forming a gate electrode on a substrate, forming a gate insulating layer on the gate electrode, forming an organic semiconductor layer on the gate insulating layer, forming a source electrode and a drain electrode on the organic semiconductor layer, and, if necessary, forming an overcoat.

FIG. 2 is a schematic cross-sectional diagram illustrating the structure of a bottom-gate/bottom-contact type organic thin film transistor which is one exemplary embodiment of the present invention. This organic thin film transistor has a substrate 1, a gate electrode 2 formed on the substrate 1, a gate insulating layer 3 formed on the gate electrode 2, a source electrode 5 and a drain electrode 6 formed across a channel portion on the gate insulating layer 3, an organic semiconductor layer 4 formed on the source electrode 5 and the drain electrode 6, and an overcoat 7 covering the whole body of the device.

Bottom-gate/bottom-contact type organic thin film transistors can be produced by, for example, forming a gate electrode on a substrate, forming a gate insulating layer on the gate electrode, forming a source electrode and a drain electrode on the gate insulating layer, forming an organic semiconductor layer on the source electrode and the drain electrode, and, if necessary, forming an overcoat.

The formation of the gate insulating layer is carried out by preparing an insulating layer application liquid by, if necessary, further adding a solvent or the like to a resin composition for gate insulation, applying the insulating layer application liquid to a gate electrode, and drying it to cure. The organic solvent to be used for the insulating layer application liquid is not particularly restricted if it can dissolve a macromolecular compound and a cross-linking agent and it is preferably an organic solvent of which boiling point under ordinary pressure is 100° C. to 200° C. Examples of the organic solvent include 2-heptanone and propylene glycol monomethyl ether acetate. A leveling agent, a surfactant, a curing catalyst, and so on may be added to the insulating layer application liquid according to need.

The insulating layer application liquid can be applied onto the gate electrode by conventional spin coating, a die coater, screen printing, inkjet, or the like.

The drying performed in the process of forming the gate insulating layer means the removal of the solvent of the resin composition applied. Curing means the cross-linking of a resin composition. The process in which the resin composition of the present invention cross-links includes a stage in which a first functional group is unblocked in the macromolecular compound (A) to generate a second functional group capable of reacting with active hydrogen as a first stage and a stage in which the generated second functional group reacts with an active hydrogen compound (B) as a second stage. When the first stage and the second stage both for cross-linking are compared, the first state is slower in reaction rate than the second stage and, therefore, the second stage proceeds automatically if the first stage proceeds once. Therefore, in order to cure the resin composition, it is just necessary to advance the first stage for cross-linking.

In order to advance the first stage, it is necessary to apply an electromagnetic wave or heat, and such means as application of an electromagnetic wave and calcination are included as a specific means. The application of an electromagnetic wave can be carried out by using, for example, an aligner that is in use for the production of semiconductors or a UV lamp that is in use for curing UV-curable resins. The calcination can be carried out by heating at a relatively high temperature, for example, a temperature of 80 to 300° C., preferably 120 to 250° C., for 5 minutes to 2 hours, preferably 10 minutes to about 1 hour. The exposure conditions and the calcination condition for unblocking the first functional group contained in the macromolecular compound (A) are determined appropriately according to the kind, the amount, and so on of the first functional group.

The contact angle of the gate insulating layer with respect to pure water is adjusted appropriately by increasing or reducing the hydrophilicity of a surface in view of the amounts of fluorine, hydrophobic functional groups, and hydrophilic functional groups which the resin to be used for the layer formation has. The increase and the reduction of the surface hydrophilicity of the gate insulating layer can be carried out by heating in various gas atmospheres. For example, if the heating or calcination (drying, curing, etc.) that is carried out in forming a gate insulating layer is carried out in an atmosphere containing oxygen, the surface hydrophilicity increases, and if it is carried out in an inert gas atmosphere, the surface hydrophilicity decreases. When heating is carried out in an atmosphere containing oxygen, the surface hydrophilicity increases if the temperature is made higher.

On the gate insulating layer may be formed a self-assembled monomolecular film layer. The self-assembled monomolecular film layer can be formed by, for example, treating the gate insulating layer with a solution in which 1 to 10% by weight of an alkylchlorosilane compound or an alkylalkoxysilane compound has been dissolved in an organic solvent.

Examples of the alkylchlorosilane compound include methyltrichlorosilane, ethyltrichlorosilane, butyltrichlorosilane, decyltrichlorosilane, and octadecyltrichlorosilane. Examples of the alkylalkoxysilane compound include methyltrimethoxysilane, ethyltrimethoxysilane, butyltrimethoxysilane, decyltrimethoxysilane, and octadecyltrimethoxysilane.

The substrate 1, the gate electrode 2, the source electrode 5, the drain electrode 6, and the organic semiconductor layer 4 may be constituted using materials and methods that are used usually. For example, a plate or a film of resin or plastics, a glass plate, a silicon plate, or the like is used for the material of the substrate. The electrodes are formed by a known method, such as a vacuum deposition method, a sputtering method, a printing method, and an inkjet method using chromium, gold, silver, aluminum, or the like as their material.

$\pi$-Conjugated polymers are used widely as an organic semiconductor compound and, for example, polypyrroles, polythiophenes, polyanilines, polyallylamines, fluorenes, polycarbazoles, polyindoles, and poly(p-phenylenevinylene)s can be used. Moreover, low-molecular substances soluble in organic solvents, e.g., derivatives of polycyclic aromatics such as pentacene, phthalocyanine derivatives, perylene derivatives, tetrathiafulvalene derivatives, tetracyanoquinodimethane derivatives, fullerenes, and carbon nanotubes, can be used. Specific examples include a condensate of 9,9-di-n-octylfluorene-2,7-di(ethylene boronate) and 5,5'-dibromo-2,2'-bithiophene.

The formation of the organic semiconductor layer is carried out by, for example, preparing an organic semiconductor application liquid by, if necessary, adding a solvent or the like to an organic semiconductor compound, applying it onto a gate insulating layer, and drying it. In the present invention, the resin that constitutes the gate insulating layer has a phenyl moiety or a carbonyl moiety and has affinity with an organic semiconductor compound. Therefore, a uniform flat interface is formed between an organic semiconductor layer and a gate insulating layer by the above-mentioned applying drying method.

The solvent to be used is not particularly restricted if it is one that dissolves or disperses organic semiconductor compounds and it is preferably one of which boiling point under ordinary pressure is 50° C. to 200° C. Examples of the solvent include chloroform, toluene, anisole, 2-heptanone, and propylene glycol monomethyl ether acetate. Like the above-mentioned insulating layer application liquid, the organic semiconductor application liquid can be applied onto the gate insulating layer by conventional spin coating, a die coater, screen printing, inkjet, or the like.

The organic thin film transistor of the present invention may be coated with an overcoat material for the purpose of protecting the organic thin film transistor and improving the smoothness of its surface.

By the use of the organic thin film transistor of the present invention, a member for displays that has an organic thin film transistor can be produced well. By the use of the member for displays that has an organic thin film transistor, a display that has a member for displays can be produced well.

EXAMPLES

The present invention is described below in more detail by way of Examples, but it is not needless to say that the invention is not limited by the Examples. In the chemical formulae of the Examples, subscript numbers of parentheses denote molar fractions of repeating units.

Synthesis Example 1

A 50-ml pressure-resistant container (produce by ACE) was charged with 2.06 g of styrene (produced by Wako Pure Chemical Industries, Ltd.), 2.43 g of 2,3,4,5,6-pentafluorostyrene (produced by Aldrich), 1.00 g of 2-[O-[1'-methylpropylideneamino]carboxyamino]ethyl-methacrylate (produced by Showa Denko K.K., commercial name "Karenz MOI-BM"), 0.06 g of 2,2'-azobis(2-methylpropionitrile), and 14.06 g of 2-heptanone (produced by Wako Pure Chemical Industries, Ltd.) and was sealed tightly after bubbling with nitrogen. Polymerization was carried out in an oil bath of 60° C. for 48 hours, so that a viscous 2-heptanone solution containing macromolecular compound 1 dissolved was obtained. The chemical structure of macromolecular compound 1 is as follows.

[Chemical Formula 9]

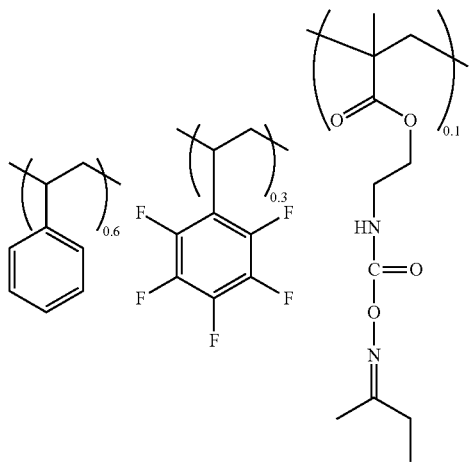

The weight average molecular weight of the resulting macromolecular compound 1 calculated from standard polystyrene was 32800 (GPC manufactured by Shimadzu, one Tskgel super HM-H 1 and one Tskgel super 112000, mobile phase=THF).

Synthesis Example 2

A 125-ml pressure-resistant container (produce by ACE) was charged with 22.22 g of vinyl benzoate (produced by Aldrich), 14.56 g of 2,3,4,5,6-pentafluorostyrene (produced by Aldrich), 6.00 g of 2-[O-[1'-methylpropylideneamino]carboxyamino]ethyl-methacrylate (produced by Showa Denko K.K., commercial name "Karenz MOI-BM"), 0.43 g of 2,2'-azobis(2-methylpropionitrile), and 64.17 g of 2-heptanone (produced by Wako Pure Chemical Industries, Ltd.) and was sealed tightly after bubbling with nitrogen. Polymerization was carried out in an oil bath of 60° C. for 48 hours, so that a viscous 2-heptanone solution containing macromolecular compound 2 dissolved was obtained. The chemical structure of macromolecular compound 2 is as follows.

[Chemical Formula 10]

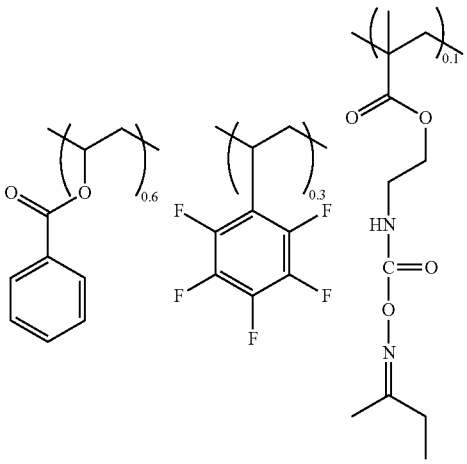

The weight average molecular weight of the resulting macromolecular compound 2 calculated from standard polystyrene was 21000 (GPC manufactured by Shimadzu, one Tskgel super HM-H 1 and one Tskgel super H2000, mobile phase=THF).

Synthesis Example 3

To a mixture of 6.40 g of 9,9-di-n-octylfluorene-2,7-di (ethylene boronate) and 4.00 g of 5,5'-dibromo-2,2'-bithiophene in toluene (80 mL) were added under nitrogen 0.18 g of tetrakis(triphenyl phosphine)palladium, 1.0 g of methyltrioctylammonium chloride (produced by Aldrich, commercial name "Aliquat 336" (registered trademark)), and 24 mL of 2M aqueous sodium carbonate solution. The resulting mixture was stirred vigorously and heated to reflux for 24 hours. A viscous reaction mixture was poured into 500 mL of acetone, so that fibrous yellow polymer was precipitated. This polymer was collected by filtration, washed with acetone, and dried at 60° C. in a vacuum oven overnight. The resulting polymer is called macromolecular compound 3. The chemical structure of macromolecular compound 3 is as follows.

[Chemical Formula 11]

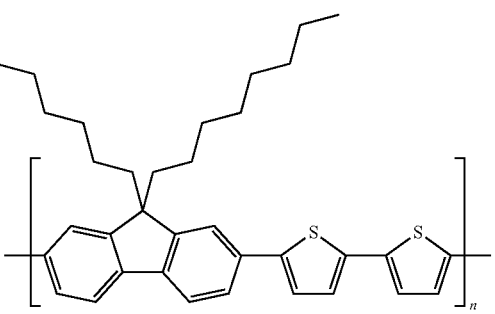

wherein n is an integer.

The weight average molecular weight of the resulting macromolecular compound 3 calculated from standard polystyrene was 61000 (GPC manufactured by Shimadzu, one Tskgel super HM-H 1 and one Tskgel super 112000, mobile phase=THF).

Synthesis Example 4

A 125-ml pressure-resistant container (produce by ACE) was charged with 3.50 g of 4-aminostyrene (produced by Aldrich), 13.32 g of 2,3,4,5,6-pentafluorostyrene (produced by Aldrich), 0.08 g of 2,2'-azobis(2-methylpropionitrile), and 25.36 g of 2-heptanone (produced by Wako Pure Chemical Industries, Ltd.) and was sealed tightly after bubbling with nitrogen. Polymerization was carried out in an oil bath of 60° C. for 48 hours, so that a viscous 2-heptanone solution containing macromolecular compound 4 dissolved was obtained. The chemical structure of macromolecular compound 4 is as follows.

[Chemical Formula 12]

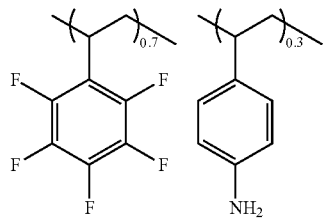

The weight average molecular weight of the resulting macromolecular compound 4 calculated from standard polystyrene was 132000 (GPC manufactured by Shimadzu, one Tskgel super HM-H 1 and one Tskgel super H2000, mobile phase=THF).

Synthesis Example 5

A 125-ml pressure-resistant container (produce by ACE) was charged with 28.31 g of 2,3,4,5,6-pentafluorostyrene (produced by Aldrich), 15.00 g of 2-[O-[1'-methylpropylideneamino]carboxyamino]ethyl-methacrylate (produced by Showa Denko K.K., commercial name "Karenz MOI-BM"), 0.43 g of 2,2'-azobis(2-methylpropionitrile), and 65.61 g of 2-heptanone (produced by Wako Pure Chemical Industries, Ltd.) and was sealed tightly after bubbling with nitrogen. Polymerization was carried out in an oil bath of 60° C. for 48 hours, so that a viscous 2-heptanone solution containing macromolecular compound 5 dissolved was obtained. The chemical structure of macromolecular compound 5 is as follows.

[Chemical Formula 13]

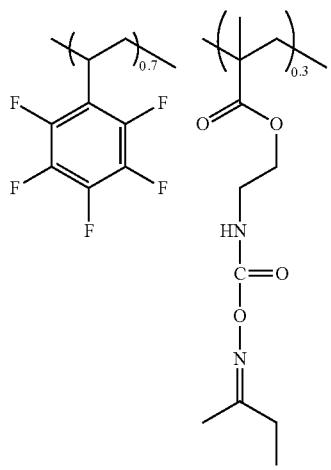

The weight average molecular weight of the resulting macromolecular compound 5 calculated from standard polystyrene was 28000 (GPC manufactured by Shimadzu, one Tskgel super HM-H 1 and one Tskgel super H2000, mobile phase=THF).

Synthesis Example 6

A 50-ml pressure-resistant container (produce by ACE) was charged with 4.04 g of 2,3,4,5,6-pentafluorostyrene (produced by Aldrich), 2.80 g of 2-trifluoroethyl methacrylate (produced by Aldrich), 1.00 g of 2-[O-[1'-methylpropylideneamino]carboxyamino]ethyl-methacrylate (produced by Showa Denko K.K., commercial name "Karenz MOI-BM"), 0.04 g of 2,2'-azobis(2-methylpropionitrile), and 11.77 g of 2-heptanone (produced by Wako Pure Chemical Industries, Ltd.) and was sealed tightly after bubbling with nitrogen. Polymerization was carried out in an oil bath of 60° C. for 48 hours, so that a viscous 2-heptanone solution containing macromolecular compound 6 dissolved was obtained. The chemical structure of macromolecular compound 6 is as follows.

[Chemical Formula 14]

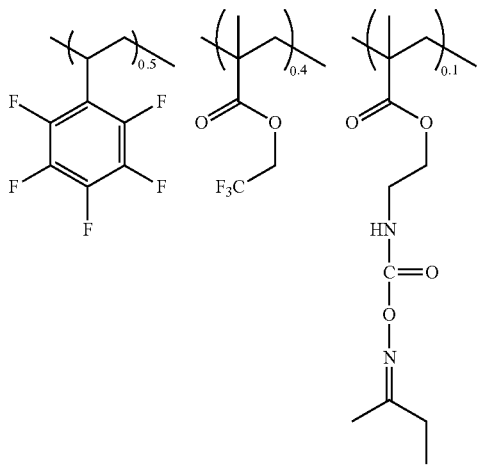

The weight average molecular weight of the resulting macromolecular compound 6 calculated from standard polystyrene was 50000 (GPC manufactured by Shimadzu, one Tskgel super HM-H 1 and one Tskgel super H2000, mobile phase=THF).

Synthesis Example 7

A 50-ml pressure-resistant container (produce by ACE) was charged with 2.17 g of styrene (produced by Aldrich), 2.80 g of 2-trifluoroethyl methacrylate (produced by Aldrich), 1.00 g of 2-[O-[1'-methylpropylideneamino]carboxyamino]ethyl-methacrylate (produced by Showa Denko K.K., commercial name "Karenz MOI-BM"), 0.06 g of 2,2'-azobis(2-methylpropionitrile), and 11.77 g of 2-heptanone (produced by Wako Pure Chemical Industries, Ltd.) and was sealed tightly after bubbling with nitrogen. Polymerization was carried out in an oil bath of 60° C. for 48 hours, so that a viscous 2-heptanone solution containing macromolecular compound 7 dissolved was obtained. The chemical structure of macromolecular compound 7 is as follows.

[Chemical Formula 15]

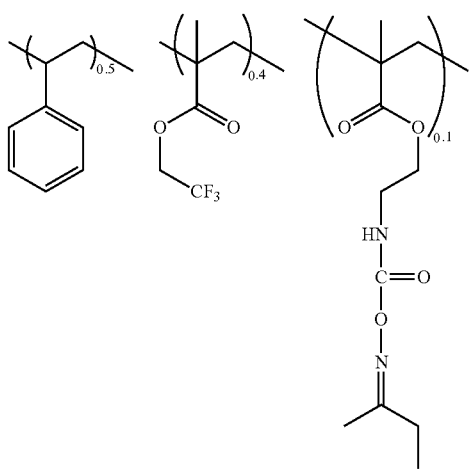

The weight average molecular weight of the resulting macromolecular compound 7 calculated from standard polystyrene was 32000 (GPC manufactured by Shimadzu, one Tskgel super HM-H 1 and one Tskgel super H2000, mobile phase=THF).

Synthesis Example 8

A 50-ml pressure-resistant container (produce by ACE) was charged with 1.66 g of styrene (produced by Wako Pure Chemical Industries, Ltd.), 3.87 g of 2,3,4,5,6-pentafluorostyrene (produced by Aldrich), 1.00 g of 2-[N-[1',3'-dimethylpyrazolyl]carboxyamino]ethyl-methacrylate (produced by Showa Denko K.K., commercial name "Karenz MOI-BP"), 0.03 g of 2,2'-azobis(2-methylpropionitrile), and 9.79 g of 2-heptanone (produced by Wako Pure Chemical Industries, Ltd.) and was sealed tightly after bubbling with nitrogen. Polymerization was carried out in an oil bath of 60° C. for 48 hours, so that a viscous 2-heptanone solution containing macromolecular compound 8 dissolved was obtained. The chemical structure of macromolecular compound 8 is as follows.

[Chemical Formula 16]

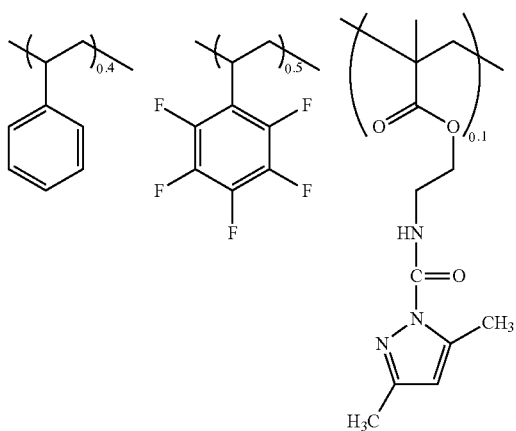

The weight average molecular weight of the resulting macromolecular compound 8 calculated from standard polystyrene was 57000 (GPC manufactured by Shimadzu, one Tskgel super HM-H 1 and one Tskgel super H2000, mobile phase=THF).

Synthesis Example 9

A 50-ml pressure-resistant container (produce by ACE) was charged with 3.64 g of styrene (produced by Wako Pure Chemical Industries, Ltd.), 3.01 g of 4-trifluorostyrene (produced by Aldrich), 1.40 g of 2-[O-[1'-methylpropylideneamino]carboxyamino]ethyl-methacrylate (produced by Showa Denko K.K., commercial name "Karenz MOI-BM"), 0.08 g of 2,2'-azobis(2-methylpropionitrile), and 18.79 g of 2-heptanone (produced by Wako Pure Chemical Industries, Ltd.) and was sealed tightly after bubbling with nitrogen. Polymerization was carried out in an oil bath of 60° C. for 48 hours, so that a viscous 2-heptanone solution containing macromolecular compound 9 dissolved was obtained. The chemical structure of macromolecular compound 9 is as follows.

[Chemical Formula 17]

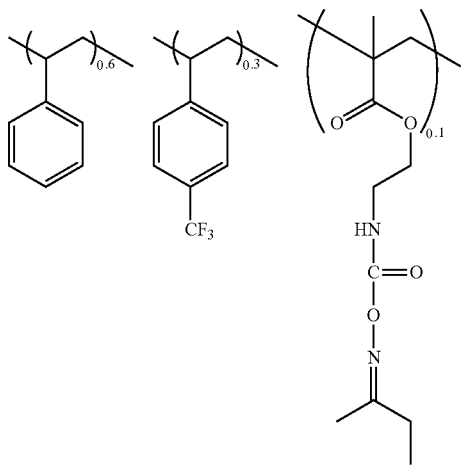

The weight average molecular weight of the resulting macromolecular compound 9 calculated from standard polystyrene was 33000 (GPC manufactured by Shimadzu, one Tskgel super HM-H 1 and one Tskgel super H2000, mobile phase=THF).

Synthesis Example 10

A 50-ml pressure-resistant container (produce by ACE) was charged with 3.64 g of styrene (produced by Wako Pure Chemical Industries, Ltd.), 3.01 g of 2-trifluorostyrene (produced by Aldrich), 1.40 g of 2-[O-[1'-methylpropylideneamino]carboxyamino]ethyl-methacrylate (produced by Showa Denko K.K., commercial name "Karenz MOI-BM"), 0.08 g of 2,2'-azobis(2-methylpropionitrile), and 18.79 g of 2-heptanone (produced by Wako Pure Chemical Industries, Ltd.) and was sealed tightly after bubbling with nitrogen. Polymerization was carried out in an oil bath of 60° C. for 48 hours, so that a viscous 2-heptanone solution containing macromolecular compound 10 dissolved was obtained. The chemical structure of macromolecular compound 10 is as follows.

[Chemical Formula 18]

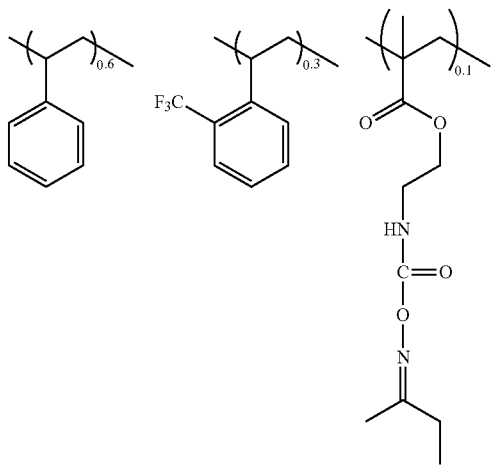

The weight average molecular weight of the resulting macromolecular compound 10 calculated from standard polystyrene was 22000 (GPC manufactured by Shimadzu, one Tskgel super HM-H 1 and one Tskgel super H2000, mobile phase=THF).

Synthesis Example 11

A 50-ml pressure-resistant container (produce by ACE) was charged with 3.64 g of styrene (produced by Wako Pure Chemical Industries, Ltd.), 3.01 g of 3-trifluorostyrene (produced by Aldrich), 1.40 g of 2-[O-[1'-methylpropylideneamino]carboxyamino]ethyl-methacrylate (produced by Showa Denko K.K., commercial name "Karenz MOI-BM"), 0.08 g of 2,2'-azobis(2-methylpropionitrile), and 18.79 g of 2-heptanone (produced by Wako Pure Chemical Industries, Ltd.) and was sealed tightly after bubbling with nitrogen. Polymerization was carried out in an oil bath of 60° C. for 48 hours, so that a viscous 2-heptanone solution containing macromolecular compound 11 dissolved was obtained. The chemical structure of macromolecular compound 11 is as follows.

[Chemical Formula 19]

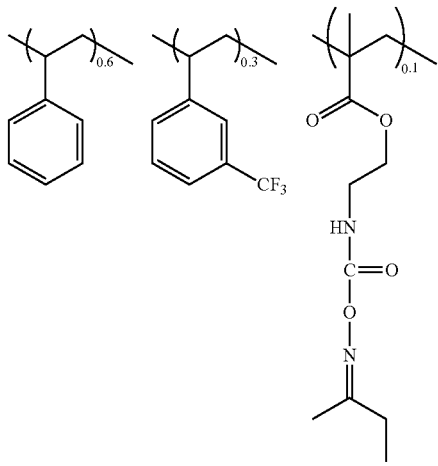

The weight average molecular weight of the resulting macromolecular compound 11 calculated from standard polystyrene was 27000 (GPC manufactured by Shimadzu, one Tskgel super HM-H 1 and one Tskgel super H2000, mobile phase=THF).

Synthesis Example 12

A 125-ml pressure-resistant container (produce by ACE) was charged with 15.00 g of 4-[(2'-ethoxy)ethoxy]styrene (produced by Tosoh Organic Chemical Co., Ltd.), 15.16 g of 2,3,4,5,6-pentafluorostyrene (produced by Aldrich), 0.30 g of 2,2'-azobis(2-methylpropionitrile), and 70.38 g of 2-heptanone (produced by Wako Pure Chemical Industries, Ltd.) and was sealed tightly after bubbling with nitrogen. Polymerization was carried out in an oil bath of 60° C. for 48 hours, so that a viscous 2-heptanone solution was obtained.

Into a 50-ml beaker was charged 5.00 g of an ion exchange resin (DIAION RCP160M, produced by Mitsubishi Chemical K.K.), which was then washed with 20 ml of anhydrous ethanol and filtered three times and further washed with 50 ml of 2-heptanone and filtered, so that an ion exchange resin that had been solvent-replaced with 2-heptanone was obtained.

The ion exchange resin that had been solvent-replaced with 2-heptanone and a stirring bar were put into a 125-ml pressure-resistant container containing a viscous 2-heptanone solution, followed by stirring with a magnetic stirrer at room temperature for 5 hours. After the completion of stirring, the viscous 2-heptanone solution was separated by filtration after being left at rest for a while, and then it was dropped into 1000 ml of hexane, so that a polymer was reprecipitated. The resulting polymer was filtered and dried, so that macromolecular compound 12 was obtained in the form of a white powder. The yield was 25 g. The chemical structure of macromolecular compound 12 is as follows.

[Chemical Formula 20]

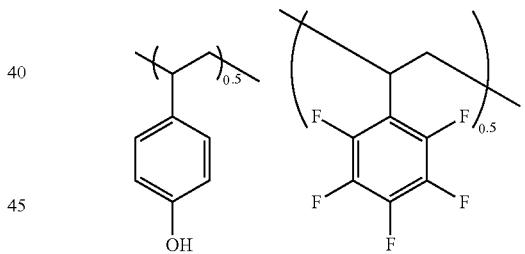

The weight average molecular weight of the resulting macromolecular compound 12 calculated from standard polystyrene was 56000 (GPC manufactured by Shimadzu, one Tskgel super HM-H 1 and one Tskgel super 112000, mobile phase=THF).

Synthesis Example 13

A 50-ml pressure-resistant container (produce by ACE) was charged with 2.60 g of styrene (produced by Wako Pure Chemical Industries, Ltd.), 3.64 g of 2,3,4,5,6-pentafluorostyrene (produced by Aldrich), 0.66 g of acrylonitrile (produced by Wako Pure Chemical Industries, Ltd.), 1.50 g of 2-[O-[1'-methylpropylideneamino]carboxyamino]ethyl-methacrylate (produced by Showa Denko K.K., commercial name "Karenz MOI-BM"), 0.09 g of 2,2'-azobis(2-methylpropionitrile), and 18.06 g of 2-heptanone (produced by Wako Pure Chemical Industries, Ltd.) and was sealed tightly after bubbling with nitrogen. Polymerization was carried out in an oil bath of 60° C. for 48 hours, so that a viscous 2-heptanone solution containing macromolecular compound 13 dissolved was obtained. The chemical structure of macromolecular compound 13 is as follows.

[Chemical Formula 21]

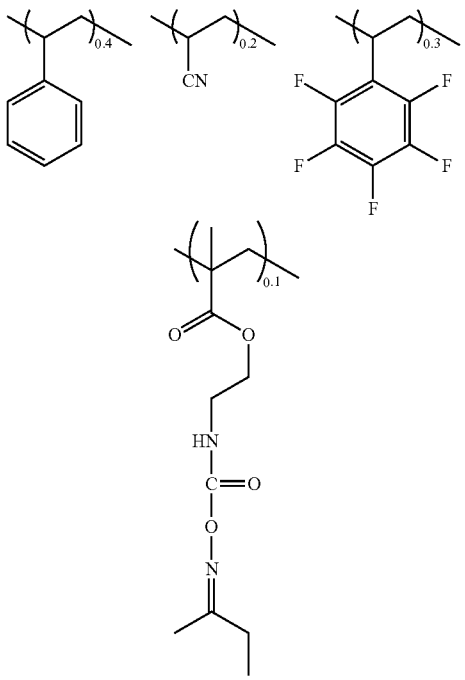

The weight average molecular weight of the resulting macromolecular compound 13 calculated from standard polystyrene was 38000 (GPC manufactured by Shimadzu, one Tskgel super HM-H 1 and one Tskgel super H2000, mobile phase=THF).

Synthesis Example 14

A 125-ml pressure-resistant container (produce by ACE) was charged with 22.41 g of vinyl benzoate (produced by Aldrich), 14.68 g of 2,3,4,5,6-pentafluorostyrene (produced by Aldrich), 3.00 g of 4-aminostyrene (produced by Aldrich), 0.40 g of 2,2'-azobis(2-methylpropionitrile), and 60.14 g of 2-heptanone (produced by Wako Pure Chemical Industries, Ltd.) and was sealed tightly after bubbling with nitrogen. Polymerization was carried out in an oil bath of 60° C. for 48 hours, so that a viscous 2-heptanone solution containing macromolecular compound 14 dissolved was obtained. The chemical structure of macromolecular compound 14 is as follows.

[Chemical Formula 22]

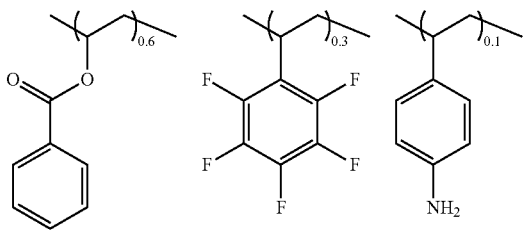

The weight average molecular weight of the resulting macromolecular compound 14 calculated from standard polystyrene was 27000 (GPC manufactured by Shimadzu, one Tskgel super HM-H 1 and one Tskgel super H2000, mobile phase=THF).

Synthesis Example 15

A 125-ml pressure-resistant container (produce by ACE) was charged with 18.52 g of vinyl benzoate (produced by Aldrich), 14.56 g of 2,3,4,5,6-pentafluorostyrene (produced by Aldrich), 12.00 g of 2-[O-[1'-methylpropylideneamino]carboxyamino]ethyl-methacrylate (produced by Showa Denko K.K., commercial name "Karenz MOI-BM"), 0.45 g of 2,2'-azobis(2-methylpropionitrile), and 67.62 g of 2-heptanone (produced by Wako Pure Chemical Industries, Ltd.) and was sealed tightly after bubbling with nitrogen. Polymerization was carried out in an oil bath of 60° C. for 48 hours, so that a viscous 2-heptanone solution containing macromolecular compound 15 dissolved was obtained. The chemical structure of macromolecular compound 15 is as follows.

[Chemical Formula 23]

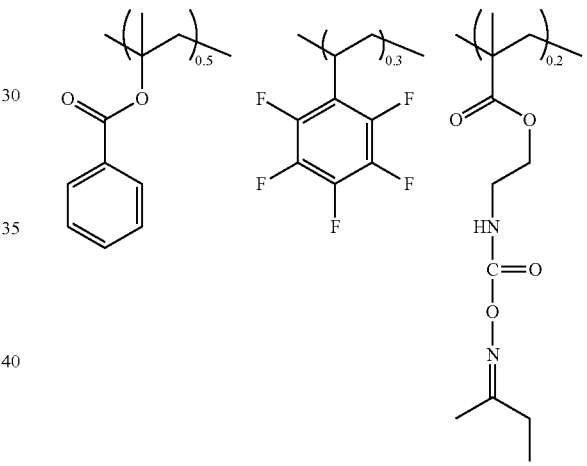

The weight average molecular weight of the resulting macromolecular compound 2 calculated from standard polystyrene was 26000 (GPC manufactured by Shimadzu, one Tskgel super HM-H 1 and one Tskgel super H2000, mobile phase=THF).

Synthesis Example 16

A 50-ml pressure-resistant container (produce by ACE) was charged with 2.02 g of styrene (produced by Wako Pure Chemical Industries, Ltd.), 4.72 g of 2,3,4,5,6-pentafluorostyrene (produced by Aldrich), 0.70 g of 4-hydroxybutyl acrylate (produced by Nippon Kasei Chemical Co. Ltd.), 0.08 g of 2,2'-azobis(2-methylpropionitrile), and 17.55 g of 2-heptanone (produced by Wako Pure Chemical Industries, Ltd.) and was sealed tightly after bubbling with nitrogen. Polymerization was carried out in an oil bath of 60° C. for 48 hours, so that a viscous 2-heptanone solution containing macromolecular compound 16 dissolved was obtained. The chemical structure of macromolecular compound 16 is as follows.

[Chemical Formula 24]

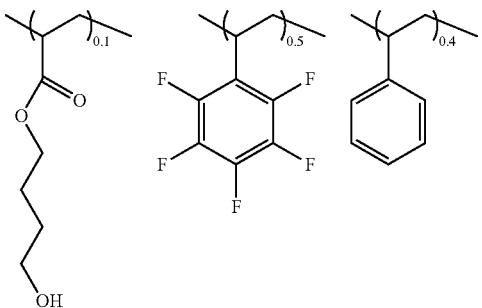

The weight average molecular weight of the resulting macromolecular compound 16 calculated from standard polystyrene was 37000 (GPC manufactured by Shimadzu, one Tskgel super HM-H 1 and one Tskgel super 112000, mobile phase=THF).

Example 1

Into a 10-ml sample bottle were charged 3.00 g of 2-heptanone solution of the macromolecular compound 1 obtained in Synthesis Example 1, 0.034 g of 1,4-dihydroxybenzene represented by the formula:

[Chemical Formula 25]

and 1.50 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 220° C. for 30 minutes, so that a gate insulating layer was obtained.

Then, the macromolecular compound 3 was dissolved in chloroform, which was a solvent, to prepare a solution (an organic semiconductor composition) having a concentration of 0.5% by weight, and this was filtered with a membrane filter to prepare an application liquid.

The resulting application liquid was applied onto the gate insulating layer by a spin coating method to form an active layer being about 60 nm in thickness, and subsequently a source electrode and a drain electrode each having a channel length of 20 μm and a channel width of 2 mm were formed on the active layer by a vacuum deposition method using a metal mask (each of the electrodes having a layered structure in the order fullerene and gold from the active layer side), so that an electric field effect type organic thin film transistor was produced.

Example 2

Into a 10-ml sample bottle were charged 3.00 g of 2-heptanone solution of the macromolecular compound 2 obtained in Synthesis Example 2, 0.077 g of 1,3-bis(3'-aminophenoxy)benzene represented by the formula:

[Chemical Formula 26]

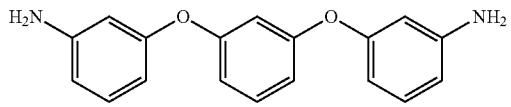

and 1.50 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 150° C. for 30 minutes, so that a gate insulating layer was obtained.

Subsequently, an electric field effect type organic thin film transistor was produced in the same manner as in Example 1.

Example 3

An electric field effect type organic thin film transistor was produced in the same manner as in Example 2 except for performing the calcination of a gate insulating layer on a hot plate at 200° C. for 30 minutes.

Example 4

An electric field effect type organic thin film transistor was produced in the same manner as in Example 2 except for performing the calcination of a gate insulating layer on a hot plate at 220° C. for 30 minutes.

Example 5

An electric field effect type organic thin film transistor was produced in the same manner as in Example 2 except for performing the calcination of a gate insulating layer in a nitrogen atmosphere on a hot plate at 220° C. for 30 minutes.

Example 6

An electric field effect type organic thin film transistor was produced in the same manner as in Example 1, except for using 0.034 g of p-phenylenediamine instead of 1,4-dihydroxybenzene.

Example 7

Into a 10-ml sample bottle were charged 2.00 g of 2-heptanone solution of the macromolecular compound 1 obtained in Synthesis Example 1, 0.79 g of 2-heptanone solution of the macromolecular compound 4 obtained in Synthesis Example 4, and 2.00 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 220° C. for 30 minutes, so that a gate insulating layer was obtained.

Subsequently, an electric field effect type organic thin film transistor was produced in the same manner as in Example 1.

Example 8

Into a 10-ml sample bottle were charged 1.00 g of 2-heptanone solution of the macromolecular compound 5 obtained in Synthesis Example 5, 0.83 g of 2-heptanone solution of the macromolecular compound 4 obtained in Synthesis Example 4, and 2.00 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 220° C. for 30 minutes, so that a gate insulating layer was obtained.

Subsequently, an electric field effect type organic thin film transistor was produced in the same manner as in Example 1.

Example 9

Into a 10-ml sample bottle were charged 2.00 g of 2-heptanone solution of the macromolecular compound 6 obtained in Synthesis Example 6, 0.61 g of 2-heptanone solution of the macromolecular compound 4 obtained in Synthesis Example 4, and 2.50 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 100° C. for 10 minutes, at 150° C. for 10 minutes, and at 220° C. for 30 minutes, so that a gate insulating layer was obtained.

Subsequently, an electric field effect type organic thin film transistor was produced in the same manner as in Example 1.

Example 10

Into a 10-ml sample bottle were charged 2.00 g of 2-heptanone solution of the macromolecular compound 7 obtained in Synthesis Example 7, 0.60 g of 2-heptanone solution of the macromolecular compound 4 obtained in Synthesis Example 4, and 1.50 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 100° C. for 10 minutes, at 150° C. for 10 minutes, and at 220° C. for 30 minutes, so that a gate insulating layer was obtained.

Subsequently, an electric field effect type organic thin film transistor was produced in the same manner as in Example 1.

Example 11

Into a 10-ml sample bottle were charged 2.00 g of 2-heptanone solution of the macromolecular compound 8 obtained in Synthesis Example 8, 0.70 g of 2-heptanone solution of the macromolecular compound 4 obtained in Synthesis Example 4, and 2.50 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 100° C. for 10 minutes, at 150° C. for 10 minutes, and at 220° C. for 30 minutes, so that a gate insulating layer was obtained.

Subsequently, an electric field effect type organic thin film transistor was produced in the same manner as in Example 1.

Example 12

Into a 10-ml sample bottle were charged 3.00 g of 2-heptanone solution of the macromolecular compound 9 obtained in Synthesis Example 9, 0.036 g of 1,4-dihydroxybenzene, and 1.50 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 200° C. for 30 minutes, so that a gate insulating layer was obtained.

Subsequently, an electric field effect type organic thin film transistor was produced in the same manner as in Example 1.

Example 13

Into a 10-ml sample bottle were charged 6.00 g of 2-heptanone solution of the macromolecular compound 10 obtained in Synthesis Example 10, 0.072 g of 1,4-dihydroxybenzene, and 3.00 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 200° C. for 30 minutes, so that a gate insulating layer was obtained.

Subsequently, an electric field effect type organic thin film transistor was produced in the same manner as in Example 1.

Example 14

Into a 10-ml sample bottle were charged 6.00 g of 2-heptanone solution of the macromolecular compound 11 obtained in Synthesis Example 11, 0.072 g of 1,4-dihydroxybenzene, and 3.00 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 200° C. for 30 minutes, so that a gate insulating layer was obtained.

Subsequently, an electric field effect type organic thin film transistor was produced in the same manner as in Example 1.

Example 15

Into a 10-ml sample bottle were charged 3.00 g of 2-heptanone solution of the macromolecular compound 1 obtained in Synthesis Example 1, 0.425 g of 42.4% by weight 2-heptanone solution of BOPH resin (poly{dimethyl-2-(4'-hydroxyphenyl)ethylsilylsilsesquioxane}) (produced by Toagosei Co., Ltd.), and 1.30 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 200° C. for 30 minutes, so that a gate insulating layer was obtained.

Subsequently, an electric field effect type organic thin film transistor was produced in the same manner as in Example 1.

Example 16

Into a 10-ml sample bottle were charged 3.00 g of 2-heptanone solution of the macromolecular compound 1 obtained in Synthesis Example 1, 0.195 g of powder of the macromolecular compound 12 obtained in Synthesis Example 12, and 1.50 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 200° C. for 30 minutes, so that a gate insulating layer was obtained.

Subsequently, an electric field effect type organic thin film transistor was produced in the same manner as in Example 1.

Example 17

Into a 10-ml sample bottle were charged 3.00 g of 2-heptanone solution of the macromolecular compound 13 obtained in Synthesis Example 13, 0.037 g of 1,4-dihydroxybenzene, and 1.50 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 200° C. for 30 minutes, so that a gate insulating layer was obtained.

Subsequently, an electric field effect type organic thin film transistor was produced in the same manner as in Example 1.

Example 18

Into a 10-ml sample bottle were charged 3.00 g of 2-heptanone solution of the macromolecular compound 14 obtained in Synthesis Example 14, 0.029 g of 1,4-dihydroxybenzene, and 1.50 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 200° C. for 30 minutes, so that a gate insulating layer was obtained.

Subsequently, an electric field effect type organic thin film transistor was produced in the same manner as in Example 1.

Example 19

Into a 10-ml sample bottle were charged 3.00 g of 2-heptanone solution of the macromolecular compound 1 obtained in Synthesis Example 1, 0.100 g of 2,2'-ditrifluoromethylbenzidine represented by the formula:

[Chemical Formula 27]

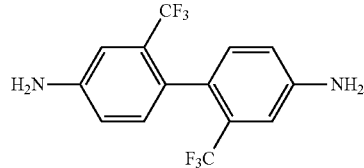

and 1.50 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 200° C. for 30 minutes, so that a gate insulating layer was obtained.

Subsequently, an electric field effect type organic thin film transistor was produced in the same manner as in Example 1.

Example 20

Into a 10-ml sample bottle were charged 3.00 g of 2-heptanone solution of the macromolecular compound 1 obtained in Synthesis Example 1, 0.091 g of 1,3-bis(3'-aminophenoxy)benzene represented by the formula:

[Chemical Formula 28]

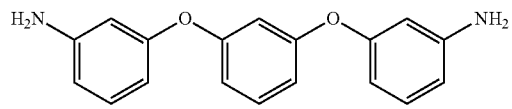

and 1.50 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 200° C. for 30 minutes, so that a gate insulating layer was obtained.

Subsequently, an electric field effect type organic thin film transistor was produced in the same manner as in Example 1.

Example 21

Into a 10-ml sample bottle were charged 3.00 g of 2-heptanone solution of the macromolecular compound 1 obtained in Synthesis Example 1, 0.091 g of di(4-hydroxy-3-nitrophenyl)ether represented by the formula:

[Chemical Formula 29]

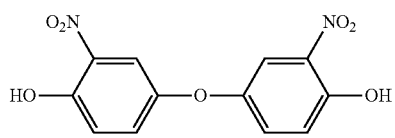

and 1.50 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 150° C. for 30 minutes, so that a gate insulating layer was obtained.

Subsequently, an electric field effect type organic thin film transistor was produced in the same manner as in Example 1.

Example 22

Into a 10-ml sample bottle were charged 2.00 g of 2-heptanone solution of the macromolecular compound 2 obtained in Synthesis Example 2, 1.86 g of 2-heptanone solution of the macromolecular compound 14 obtained in Synthesis Example 14, and 1.30 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 220° C. for 30 minutes, so that a gate insulating layer was obtained.

Subsequently, an electric field effect type organic thin film transistor was produced in the same manner as in Example 1.

Example 23

Into a 10-ml sample bottle were charged 2.00 g of 2-heptanone solution of the macromolecular compound 15 obtained in Synthesis Example 15, 3.53 g of 2-heptanone solution of the macromolecular compound 14 obtained in Synthesis Example 14, and 1.80 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 220° C. for 30 minutes, so that a gate insulating layer was obtained.

Subsequently, an electric field effect type organic thin film transistor was produced in the same manner as in Example 1.

Example 24

Into a 10-ml sample bottle were charged 2.00 g of 2-heptanone solution of the macromolecular compound 15 obtained in Synthesis Example 15 and 4.53 g of 2-heptanone solution of the macromolecular compound 16 obtained in Synthesis Example 16, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 220° C. for 30 minutes, so that a gate insulating layer was obtained.

Subsequently, an electric field effect type organic thin film transistor was produced in the same manner as in Example 1.

Example 25

Into a 10-ml sample bottle were charged 2.00 g of 2-heptanone solution of the macromolecular compound 1 obtained in Synthesis Example 1, 0.069 g of 1,3-bis(3-aminopropyl)-1,1,3,3-tetramethyldisiloxane represented by the formula:

[Chemical Formula 30]

$$H_2N\diagdown\diagup\diagdown\underset{\underset{Me}{|}}{\overset{\overset{Me}{|}}{Si}}-O-\underset{\underset{Me}{|}}{\overset{\overset{Me}{|}}{Si}}\diagdown\diagup\diagdown NH_2$$

and 2.00 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 220° C. for 30 minutes, so that a gate insulating layer was obtained.

Subsequently, an electric field effect type organic thin film transistor was produced in the same manner as in Example 1.

Example 26

Into a 10-ml sample bottle were charged 2.00 g of 2-heptanone solution of the macromolecular compound 1 obtained in Synthesis Example 1, 0.085 g of 1,4-bis(3-aminopropyldimethylsilyl)benzene represented by the formula:

[Chemical Formula 31]

$$H_2N\diagdown\diagup\diagdown\underset{\underset{Me}{|}}{\overset{\overset{Me}{|}}{Si}}-\underset{}{\underset{}{\bigcirc}}-\underset{\underset{Me}{|}}{\overset{\overset{Me}{|}}{Si}}\diagdown\diagup\diagdown NH_2$$

and 2.00 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 220° C. for 30 minutes, so that a gate insulating layer was obtained.

Subsequently, an electric field effect type organic thin film transistor was produced in the same manner as in Example 1.

Example 27

Into a 10-ml sample bottle were charged 2.00 g of 2-heptanone solution of the macromolecular compound 1 obtained in Synthesis Example 1, 0.11 g of 3-(2-aminoethylaminopropyl)tris(trimethylsiloxy)silane represented by the formula:

[Chemical Formula 32]

$$Me_3Si-O-\underset{\underset{\underset{SiMe_3}{|}}{\overset{|}{O}}}{\overset{\overset{\overset{SiMe_3}{|}}{O}}{Si}}\diagdown\diagup\diagdown\overset{H}{N}\diagdown\diagup NH_2$$

and 2.00 g of 2-heptanone, which were then stirred to dissolve, so that a homogeneous coating solution was prepared.

The resulting coating solution was filtered with a membrane filter having a pore diameter of 0.2 μm, spin-coated to a glass substrate with a chromium electrode, and then calcined on a hot plate at 220° C. for 30 minutes, so that a gate insulating layer was obtained.

Subsequently, an electric field effect type organic thin film transistor was produced in the same manner as in Example 1.

<Measurement of Contact Angle>

For each of the thus-produced gate insulating layers, a contact angle with respect to pure water was measured by using a contact angle meter CA-A (manufactured by KYOWA KAIMENCHEMICAL FORMULA).

Deionized water was used as the pure water.

<Transistor Characteristics>

For the thus-produced electric field effect type organic thin film transistors, the transistor characteristics thereof were measured by using a vacuum prober (BCT22MDC-5-HT-SCU; manufactured by Nagase Electronic Equipments Service Co., Ltd.) under such conditions that a gate voltage Vg was varied from 0 to −60V and a source-drain voltage Vsd was varied from 0 to −60 V, and the results are given in Table 1.

The hysteresis of an organic thin film transistor was expressed by a voltage difference between a threshold voltage Vth1 measured when the gate voltage Vg was varied from 0 V to −60 V and a threshold voltage Vth2 measured when the gate voltage Vg was varied from −60 V to 0 V, at a source-drain voltage Vsd of −40V.

The ON/OFF ratio of an organic thin film transistor was calculated by dividing a current value at the time of adjusting the gate voltage to 40 V by a current value at the rising of the organic thin film transistor.

Comparative Example 1

Into a 10-ml sample bottle were charged 1.00 g of polyvinylphenol-co-polymethyl methacrylate (produced by Aldrich, Mn=6700), 0.163 g of N,N,N',N',N"N"-hexamethoxymethylmelamine (produced by Sumitomo Chemical Co., Ltd.), 0.113 g of a thermal acid generator (produced by Midori Chemical Formula Co., Ltd., commercial name: TAZ-108), and 7.00 g of 2-heptanone, which were then stirred to dissolve, so that a homogeneous coating solution was prepared.

An electric field effect type organic thin film transistor was produced and the transistor characteristics thereof were measured and evaluated in the same manner as in Example 1, except for using this coating liquid for the formation of a gate insulating layer.

Comparative Example 2

An electric field effect type organic thin film transistor was produced and the transistor characteristics thereof were measured and evaluated in the same manner as in Comparative Example 1, except for using polyvinylphenol (produced by Aldrich, Mn=8000).

TABLE 1

|  | Contact angle | Hysteresis | Vth1 | ON/OFF ratio |
|---|---|---|---|---|
| Example 1 | 93.9° | 0.1 V | −1.4 V | $1.3 \times 10^5$ |
| Example 2 | 94.7° | 0.2 V | −1.9 V | $3.3 \times 10^4$ |
| Example 3 | 93.5° | 0.3 V | −2.2 V | $5.0 \times 10^4$ |
| Example 4 | 92.4° | 0.1 V | −2.6 V | $5.0 \times 10^4$ |
| Example 5 | 95.3° | 0.1 V | −2.1 V | $5.0 \times 10^4$ |
| Example 6 | 94.2° | 0.3 V | −1.3 V | $9.4 \times 10^5$ |
| Example 7 | 93.4° | 0.0 V | −1.2 V | $3.1 \times 10^4$ |
| Example 8 | 95.7° | 0.0 V | −2.5 V | $7.1 \times 10^4$ |
| Example 9 | 93.6° | 0.0 V | −2.1 V | $1.3 \times 10^4$ |
| Example 10 | 95.5° | 0.1 V | −3.7 V | $2.9 \times 10^4$ |
| Example 11 | 99.1° | 0.0 V | −2.1 V | $1.7 \times 10^4$ |
| Example 12 | 92.5° | 0.2 V | −1.5 V | $2.5 \times 10^4$ |
| Example 13 | 92.3° | 0.0 V | −1.6 V | $3.5 \times 10^4$ |
| Example 14 | 91.5° | 0.5 V | −1.4 V | $1.0 \times 10^4$ |
| Example 15 | 94.9° | 0.0 V | −2.1 V | $1.3 \times 10^5$ |
| Example 16 | 95.8° | 0.1 V | −3.4 V | $9.2 \times 10^4$ |
| Example 17 | 91.0° | 0.1 V | −2.2 V | $6.4 \times 10^4$ |
| Example 18 | 92.7° | 0.0 V | −0.6 V | $8.6 \times 10^4$ |
| Example 19 | 92.8° | 0.1 V | −1.9 V | $1.6 \times 10^5$ |
| Example 20 | 93.0° | 0.0 V | −2.9 V | $5.1 \times 10^4$ |
| Example 21 | 92.1° | 0.1 V | −2.0 V | $9.6 \times 10^4$ |
| Example 22 | 96.2° | 0.0 V | −1.4 V | $6.7 \times 10^4$ |
| Example 23 | 97.2° | 0.0 V | −1.6 V | $6.0 \times 10^4$ |
| Example 24 | 94.2° | 0.1 V | −4.8 V | $6.5 \times 10^4$ |
| Example 25 | 93.4° | 0.0 V | −2.0 V | $1.5 \times 10^5$ |
| Example 23 | 92.8° | 0.0 V | −2.0 V | $4.3 \times 10^4$ |
| Example 27 | 93.3° | 0.0 V | −2.0 V | $1.1 \times 10^5$ |
| Comparative Example 1 | 68.7° | 0.8 V | −20.9 V | $6.6 \times 10^4$ |
| Comparative Example 2 | 70.1° | 3.5 V | −50.0 V | $1.1 \times 10^3$ |

As shown in the results of the Examples, it becomes possible according to the present invention to provide organic thin film transistors that are small in the absolute value of Vth1 and in hysteresis.

DESCRIPTION OF REFERENCE NUMERALS

1 . . . Substrate,

2 . . . gate electrode,

3 . . . gate insulating layer,

4 . . . organic semiconductor layer,

5 . . . source electrode,

6 . . . drain electrodes,

7 . . . overcoat.

The invention claimed is:

1. A resin composition comprising (A) a macromolecule that comprises at least one repeating unit selected from the group consisting of repeating units represented by Formula (1), repeating units represented by Formula (1'), and repeating units represented by Formula (2) and contains two or more first functional groups in its molecule, wherein the first functional group is a functional group that generates, by the action of electromagnetic waves or heat, a second functional group that reacts with active hydrogen, and (B) at least one compound selected from the group consisting of low-molecular compounds containing two or more active hydrogens in each molecule and macromolecules containing two or more active hydrogens in each molecule:

[Chemical Formula 1]

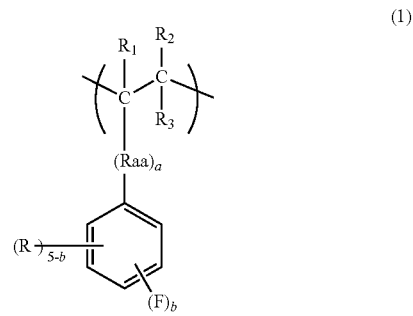

(1)

wherein $R_1$, $R_2$, and $R_3$, which are the same or different, each represent a hydrogen atom, a fluorine atom, or a monovalent organic group having 1 to 20 carbon atoms; R represents a hydrogen atom or a monovalent organic group having 1 to 20 carbon atoms, wherein a hydrogen atom in the monovalent organic group may be substituted with a fluorine atom; Raa represents a divalent organic group having 1 to 20 carbon atoms, wherein a hydrogen atom in the divalent organic group may be substituted with a fluorine atom; a represents an integer of 0 to 20 and b represents an integer of 1 to 5; when there are two or more Raa's, they may be the same or different; and when there are two or more Rs, they may be the same or different,

[Chemical Formula 2]

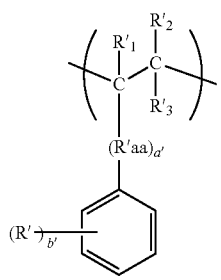
(1')

wherein R'$_1$, R'$_2$, and R'$_3$, which are the same or different, each represent a hydrogen atom, a fluorine atom, or a monovalent organic group having 1 to 20 carbon atoms; R' represents a monovalent organic group having 1 to 20 carbon atoms in which at least one hydrogen atom has been substituted with a fluorine atom; R'aa represents a divalent organic group having 1 to 20 carbon atoms, wherein a hydrogen atom in the divalent organic group may be substituted with a fluorine atom; a' represents an integer of 0 to 20 and b' represents an integer of 1 to 5; when there are two or more R'aa's, they may be the same or different; and when there are two or more R's, they may be the same or different,

[Chemical Formula 3]

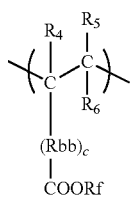
(2)

wherein R$_4$, R$_5$, and R$_6$, which are the same or different, each represent a hydrogen atom, a fluorine atom, or a monovalent organic group having 1 to 20 carbon atoms, wherein a hydrogen atom in the monovalent organic group may be substituted with a fluorine atom; Rf represents a monovalent organic group having 1 to 20 carbon atoms in which at least one hydrogen atom has been substituted with a fluorine atom; Rbb represents a divalent organic group having 1 to 20 carbon atoms, wherein a hydrogen atom in the divalent organic group may be substituted with a fluorine atom; c represents an integer of 0 to 20; when there are two or more Rbb's, they may be the same or different.

2. The resin composition according to claim 1 which is one for an organic thin film transistor gate insulating layer.

3. The resin composition according to claim 1, wherein the first functional group is at least one group selected from the group consisting of an isocyanato group blocked by a blocking agent and an isothiocyanato group blocked by a blocking agent.

4. The resin composition according to claim 3, wherein the isocyanato group blocked by a blocking agent and the isothiocyanato group blocked by a blocking agent are groups represented by Formula (3):

[Chemical Formula 4]

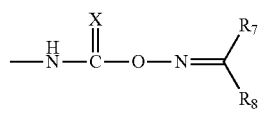
(3)

wherein X represents an oxygen atom or a sulfur atom, and R$_7$ and R$_8$, which are the same or different, each represent a hydrogen atom or a monovalent organic group having 1 to 20 carbon atoms.

5. The resin composition according to claim 3, wherein the isocyanato group blocked by a blocking agent and the isothiocyanato group blocked by a blocking agent are groups represented by Formula (4):

[Chemical Formula 5]

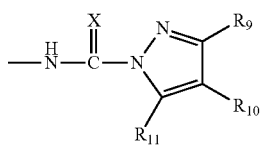
(4)

wherein X represents an oxygen atom or a sulfur atom, and R$_9$, R$_{10}$, and R$_{11}$, which are the same or different, each represent a hydrogen atom or a monovalent organic group having 1 to 20 carbon atoms.

6. A gate insulating layer of an organic thin film transistor formed with using the resin composition according to claim 1.

7. The gate insulating layer of an organic thin film transistor according to claim 6, wherein the contact angle with respect to pure water is 91 degrees or more.

8. An organic thin film transistor comprising the gate insulating layer according to claim 6.

9. The organic thin film transistor according to claim 8 which is of a bottom-gate/top-contact type or a bottom-gate/bottom-contact type.

10. A member for a display, wherein the member comprises the organic thin film transistor according to claim 8.

11. A display comprising the member for a display according to claim 10.

* * * * *